(12) United States Patent
Riley

(10) Patent No.: US 6,829,311 B1
(45) Date of Patent: Dec. 7, 2004

(54) COMPLEX VALUED DELTA SIGMA PHASE LOCKED LOOP DEMODULATOR

(75) Inventor: Tom Riley, Osgoode (CA)

(73) Assignee: Kaben Research Inc., Osgoode (CA)

( * ) Notice: Subject to any disclaimer, the term of this patent is extended or adjusted under 35 U.S.C. 154(b) by 691 days.

(21) Appl. No.: 09/664,788

(22) Filed: Sep. 19, 2000

(51) Int. Cl.[7] .......................... H04L 27/14; H04L 27/16; H04L 27/22

(52) U.S. Cl. ....................... 375/326; 375/327; 375/324; 375/344

(58) Field of Search ................................. 375/327, 326, 375/324, 340, 344, 376, 350, 351, 261; 455/209, 192.2; 341/172; 327/554

(56) References Cited

U.S. PATENT DOCUMENTS

| | | | |
|---|---|---|---|
| 4,947,409 A | | 8/1990 | Raith et al. |
| 5,003,621 A | * | 3/1991 | Gailus ........................ 455/209 |
| 5,400,366 A | | 3/1995 | Iwamatsu |
| 5,533,071 A | | 7/1996 | Krishnamurthy et al. |
| 5,841,822 A | * | 11/1998 | Mittel et al. ................. 375/350 |
| 6,608,869 B1 | * | 8/2003 | Limberg ....................... 375/261 |

FOREIGN PATENT DOCUMENTS

EP        0 519 891 A2     12/1992

* cited by examiner

Primary Examiner—Phuong Phu
(74) Attorney, Agent, or Firm—Cassan Maclean

(57) ABSTRACT

A complex valued delta sigma Phase Locked Loop (PLL) demodulator. The demodulator is a multiple stage demodulator. The first stage is a conversion stage which converts an incoming signal into a first complex representation. The second stage is a direct digital synthesizer (DDS)/mixer which synthesizes a signal to be mixed with the first complex signal and performs the mixing operation to produce a second complex output. This second complex signal is controlled by a bitstream fed back from the third stage—a phase quantizer stage. The bitstream represents the quantized phase difference between the synthesized signal and the first complex signal. The DDS/mixer stage then measures the synthesized signal for any phase difference from the incoming signal through the feedback inherent to a PLL, the bitstream thus provides an output that gives the frequency of the desired signal. As a side benefit, the real component of the second complex signal, provides an amplitude estimate of the desired signal.

38 Claims, 17 Drawing Sheets

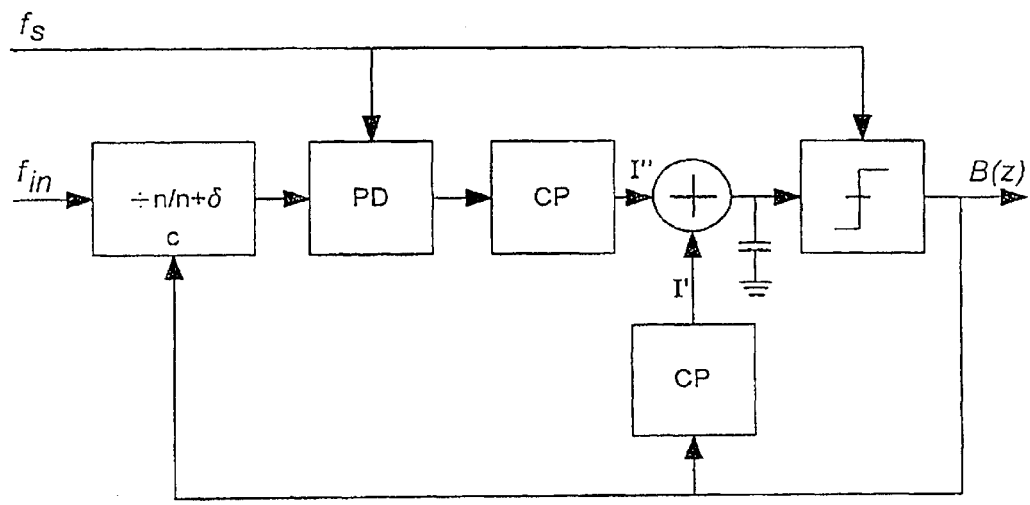
(PRIOR ART)
FIG. 1
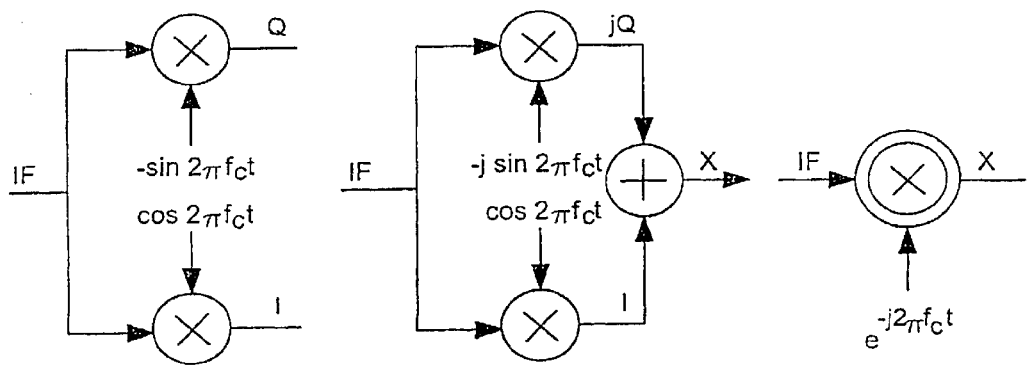
(PRIOR ART)
FIG. 2A
(PRIOR ART)
FIG. 2B
(PRIOR ART)
FIG. 2C

COMPLEX VALUED DELTA SIGMA PHASE LOCKED LOOP DEMODULATOR

FIELD OF THE INVENTION

The present invention relates to the demodulation of frequency modulated (FM) signals and, more specifically, it relates to a complex valued delta sigma phase locked loop (PLL) demodulator.

BACKGROUND TO THE INVENTION

Current mobile telephone handsets need to conserve as much power a possible to extend their battery life. Unfortunately, current FM demodulation techniques used in these handsets require multiple discrete components to implement. The multiplicity of these components leads to high power consumption and consequently, to shorter battery life. A single-chip demodulator would have lower power consumption and, theoretically, lead to longer battery life.

However, a single-chip demodulator is not the only requirement for the mobile handsets of the future. The demodulator must also provide some of the selectivity required in the receiver while simultaneously extracting the analogue FM information from the input IF signal. This is particularly important given the Advanced Mobile Phone System (AMPS) requirement for the demodulator to work properly with an interferer on the alternate channel only 60 kHz away from the desired signal on the assigned channel. The AMPS specification requires the receiver to continue to work properly when this interfering signal is 65 dB stronger than the desired signal.

Regarding current demodulation techniques, one of the more recently researched that of a $\Delta\Sigma$PLL demodulator. A generalized schematic of this approach is illustrated in FIG. 1. The principle of operation here is that the circuit is a $\Delta\Sigma$ modulator. When considered this way, the dual modulus divider (n/n+d) and phase detector (PD) provide the first integrator of a $\Delta\Sigma$ modulator. This assertion can be justified by considering that the phase detector detects phase which is inherently the integral of the divider output frequency. The two charge pumps (CP) then provide the second integration stage for a second order $\Delta\Sigma$ modulator.

The amount of quantisation noise in the output bit stream for second order noise shaping depends on the reference frequency, $f_S$, and the step size of the divider, $\delta$. In general, the divider can divide by n or n+$\delta$ where $\delta$ might be less than 1. The spectral density of the quantisation error is given approximately by $$\left.\frac{\delta}{\sqrt{12}\,f_s}(1-z^{-1})^2\right|_{=\exp(j2\Pi fT_s)}$$

and the full scale input range for the FM deviation is $\delta f_s$. This is a high pass function which places zeros in the noise at dc. Other noise shaping functions are possible and discussed in the $\Delta\Sigma$ modulator literature.

In general the quantizer need not be restricted to a single bit quantizer. In this case, the output is a multibit digital word, however we still refer to it as a bit stream. The full scale deviation is then $p\delta f_s$ where p is one greater than the number of digital levels in the bit stream. However, the demodulator of FIG. 1 can also be seen as a PLL. From this PLL point of view, the dual modulus divider (n/n+$\delta$) is like a VCO. Applying more 1's to the divider control input (c) causes the divider to divide by the larger modulus more often and, as a result, to have a lower output frequency. The phase of this divider output is sampled relative to the reference frequency in the phase detector (PD). This sampling occurs at the divider output frequency and is integrated in the first charge pump (CP) loop filter. A second charge pump feeding back from the quantiser provides the stabilizing zero necessary for stability in a second order PLL. The presence of the quantiser in this PLL, however, complicates the PLL analogy and as a result the circuit is not often presented from this point of view.

Regardless of whether or not we find it more useful to regard the demodulator as a PLL, the resulting bit stream can then be processed either with digital filtering or analog filtering. If the bit stream is analog filtered with two or more poles in the filter, the high frequency noise can be rolled off to result in a white noise at some low level. It can then be passed directly to the speaker driver.

The primary limitation with this type of demodulator is that the input signal must be sufficiently band limited to remove interfering signals. As well, the signal must be hard limited before entering the demodulator. A practical reason for these requirements is that the input frequency is used to clock the digital logic making up the divider. Under these conditions, the signal must be filtered to the point where the zero crossings of the input signal are substantially unchanged by an interfering signal. In other words, the selectivity must come before the $\Delta\Sigma$ demodulator. This offers no hope of reducing the cost of the IF filter although it does offer a means of demodulation in a single IC.

Another way of looking at the need to filter before entering this demodulator is that both the divider and the edge triggered phase detector can process only information which is contained in the zero crossings of the input signal. In the presence of a strong interferer, the zero crossings are dominated by this interferer, and the demodulator phase locks to the interfering signal. With a very large interferer, the small signal simply rides on top of the interferer and causes only a few zero crossings. As a result, the desired signal can be extracted only by looking at the amplitude information as well. With this theoretical consideration in mind, it seems unfortunate that the original $\Delta\Sigma$ FM demodulators as in FIG. 1 threw away the amplitude information at the extreme front end of the demodulator.

One approach to demodulation and filters which is most helpful is to consider complex valued signals. The approach taken here is to show that simple phasors are used to describe real signals. This concept of phasors is then extended to include the concept of complex envelope for a bandpass signal. Neither of these constitute a complex signal even though they are complex representations of a real signal.

To take a simple example of the use of phasors, assume we want to find the sum of two voltages that are both sinusoidal functions of time.

$$s(t)=A_1 \cos(\omega_c t+\phi_1)+A_2 \cos(\omega_c t+\phi_2)$$

To avoid the process of summing up sinusoids in the time domain, each of the sinusoids above can be expressed in complex exponential form i.e.

$$\cos\theta = \frac{e^{j\theta}+e^{-j\theta}}{2} = \mathrm{Re}\{e^{j\theta}\}$$

From the above, it is clear that the imaginary part of $e^{j\theta}$ will always cancel with the imaginary part of $e^{-j\theta}$ and that the real part is in fact $\cos^\theta$. Similarly, the sum of two sinusoids then becomes $$A_1\cos(\omega_c t + \varphi_1) + A_2\cos(\omega_c t + \varphi_2) = A_1 \frac{e^{j\omega_c t + \varphi_1} + e^{-j\omega_c t + \varphi_1}}{2} +$$
$$A_2 \frac{e^{j\omega_c t + \varphi_2} + e^{-j\omega_c t + \varphi_2}}{2}$$
$$= \frac{1}{2}[(A_1 e^{j\omega_c t + \varphi_1} + A_2 e^{j\omega_c t + \varphi_2}) +$$
$$(A_1 e^{(j\omega_c t + \varphi_1)} + A_2 e^{-j\omega_c t + \varphi_2})]$$

Here, the third line groups the sum into two positive frequency exponentials and the sum of two negative frequency exponentials. Again since the sum of two real signals must be another real signal, we would expect that the imaginary parts would cancel out. Some inspection of the equations will reveal that this is true. The convenience of phasor notation comes when we decide to ignore the negative frequency components. Since the imaginary parts of the sum cancel out, and the real parts of the positive frequency components are equal to the real parts of the negative frequency components, we can see that $$A_1\cos(\omega_c t + \phi_1) + A_2\cos(\omega_c t + \phi_2) = Re\{(A_1 e^{j\phi_1} + A_2 e^{j\phi_2})e^{j2\pi f_c t}\}$$

Thus for example, in a 50 Hz transformer ($f_c$=50 Hz) we get all the information we need from looking at only the term in brackets.

$$A_1 e^{j\phi_1} + A_2 e^{j\phi_2}$$

This is the well known phasor addition of the two sinusoids that we started with. By further ignoring the common factor of $e^{j2\pi f_c 1}$, the time dependency has been eliminated and only complex constants remain. Note that we end up with fixed constants for the term in brackets (the phasor) because all the signals we are looking at are at the same frequency, $f_c$.

The phasor concept can be extended to the complex envelope of a bandpass signal. Suppose that we let each of the phase offsets in the previous phasor example be a function of time, $\phi(t)$, If $\varphi(t) = (\omega_c + \omega_1)t$ and $\varphi_2(t) = (\omega_c + \omega_2)t$, then the sum of two sin usoids is $A_1\cos(\omega_c t + \omega_1 t) + A_2\cos(\omega_c t + \omega_c t)$ The complex = $\frac{1}{2}[(A_1 e^{j\omega_1 t} + A_2 e^{j\omega_2 t})e^{j2\pi f_c 1} +$
$(A_1 e^{-j\omega_1 t} + A_2 e^{-j\omega_2 t})e^{-j2\pi f_c t}]$ envelope of the sum of the two sinusoids is just the term.

$$A_1 e^{j\omega_1 t} + A_2 e^{j\omega_2 t}$$

Where the same term produced a static complex number for the phasor, the sum of two sinusoids of differing frequencies produced a complex value that is a function of time. We can now use a complex mathematical representation but the signal stays real. As with phasors, it is again possible to ignore both the negative frequency components and the carrier frequency, f. This type of analysis is routinely carried out in digital communications texts. If two sinusoids are summed, the phasors of each sinusoid are now functions of time and rotate relative to the carrier frequency.

The addition of two sinusoids results in the expected AM modulated sinusoid at a new frequency. The frequency of the AM modulation is given by the difference in frequency between the two sinusoids we are summing. The simple concept of envelope commonly seen on an oscilloscope relates to the amplitude of the AM modulation which is quite visible in the upper sinusoid. That is, at any point in time there is an envelope shown with a dotted line. The new concept which extends the old familiar concept of an envelope is to also look at the phase of the upper sinusoid relative to the phase of some arbitrarily chosen carrier frequency and phase. By having an amplitude and a phase, we have the polar representation of a complex signal. As with any complex signal, the magnitude and phase can also be represented as inphase and quadrature components.

However, clearly, the world we live in doesn't have any j operators and thus there are no true complex signals. However, many circuits contain two real signals that we would like to behave the same way as one complex signal. One way to define complex signal is to describe a way to make one.

An obvious example of use to radio work is a In-phase and Quadrature downconverter. FIG. 2(a) shows a standard block diagram for an "In-phase" and Quadrature mixer. FIG. 2(c) shows an abstract mathematical modem for same mixer.

To get the abstract model of the hardware, we can use a transitional model, shown in FIG. 2(b). To get this model, we need only to believe that j means "the other wire" and from then on we can think of X=I+jQ as one complex signal rather than two real signals. The j operator in the middle figure allows us to mathematically add the two signals to obtain FIG. 2(b) while keeping the I and Q channels separate. This addition has no corresponding component in either the hardware or the abstract model but it is fundamental to the understanding of complex filters from the point of view presented here. The transitional model, showing this addition, is therefore particularly useful because it allows recognition of the hardware in the block diagram while at the same time providing the abstract model through mathematical manipulations.

By thinking of the two real signals as one complex signal, it becomes easier to design filters for the two signals. The motive for filtering two real signals is conceptually related to the motive for using phasors or complex envelopes. Just as using a complex envelope simplifies the mathematical analysis of a real high frequency signal, the filtering of two real signals (which we hope represent the high frequency signal) can be simpler to construct than a filter for the original high frequency signal.

To represent a complex signal, at least two real signals are required. Additional signals can provide redundancy and more robust implementations. For example, if both the inphase signal and the quadrature signal are provided with their complimentary (180° phase shifted) counter parts, then there are four signals and balanced circuit techniques can be used to improve power supply rejection ratio. Similarly, the use of other redundant signals phase shifted by multiples of 45° or 5°, for example, may provide other opportunities for more robust embodiments of complex filters. Thus, a complex signal is in general represented by a plurality of real signals.

Another technique for generating complex signals is the Hilbert Transform or Hilbert Filter. An ideal Hilbert filter rejects all negative frequency exponentials while passing positive frequency exponentials. That is, given a real input (composed of equally weighted positively rotating exponentials and negatively rotating exponentials), a Hilbert Filter provides a complex output (composed of only the positively rotating exponentials). Another way of looking at the same thing is to say that the output must have a real channel with the original input signal and an imaginary channel with each sinusoidal component of the input phase shifted by exactly 90 degrees. When looking at it this way, the ideal Hilbert filter is more commonly called the Hilbert transform.

One can simply consider the Hilbert transform or Hilbert Filter as a special case of a more general class of filters called complex filters. The distinguishing feature of such filters is that they have a different frequency response for positively rotating exponentials than for negatively rotating exponentials. Thus a real input can produce a complex output by substantially removing for example, negatively rotating exponentials.

The above are not the only methods of obtaining complex signals. Complex signals can also be obtained by sampling. FIG. 3A shows an example where an IF signal is sub-sampled with a small time shift in the quadrature sample. P1 and P2 are phases that tell the Track and Hold amplifiers to hold their input value when the phases P1 or P2 are high. P3 then samples the held values coming out of the track and hold amplifiers on the falling edge of P3. FIG. 3B shows the timing diagrams associated with the circuit of FIG. 3A.

We can now consider an example where the P1 and P2 phases have an offset, $\Delta T$, of $\frac{3}{4}$ of the IF period and a sampling period, T, equal to 10 cycles of the nominal IF frequency. Specifically, for a 45 MHz nominal IF frequency we are sampling at 4.5 MHz and $\Delta T=4/(135 \text{ MHz})=29.6$ ns. FIG. 4 shows the voltages sampled onto the holding capacitors for an input frequency slightly faster than 45 MHz. By visualizing these samples as components of a complex number, we can see that they represent a positively rotating complex exponential. This is illustrated by the timing diagrams of FIG. 4.

Both the I channel and the Q channel display familiar aliasing behavior and the sampling produces a downconversion through this aliasing. It can also be seen that the I channel follows a low frequency cosine function while the Q channel follows a low frequency sine function. Thus, I+jQ follows a positively rotating complex exponential.

Now that complex signals can be obtained, they can also be used in a PLL. When so used, a complex valued phase locked loop (CVPLL) is obtained. A complex-valued PLL (CVPLL) can be analyzed in terms of FIG. 5 below. The incoming signal can be Hilbert transformed by either an inphase and quadrature downconversion or by a complex filter or a combination of both. The result will be a complex exponential represented by two real signals with some impairments depending on the accuracy of the Hilbert transform. A second component of the PLL is a VCO which produces an inphase and quadrature output. This output can be thought of as another complex exponential which we wish to phase lock to the incoming complex exponential from the Hilbert transform. The last component is a full complex multiplier which is used as a phase detector and amplitude demodulator.

The operation of the PLL can be understood by ignoring, for now, the hardware and studying the mathematical operations the circuit is intended to perform. The Hilbert transform (which may include a downconversion not shown in the figure) will give us two signals, I and Q representing the phasor of the incoming signal. Mathematically, this phasor can be expressed in either Cartesian form, I+jQ, or polar form, $Ae^{j\theta}$. FIG. 5 shows the polar form of the signal because the phase we wish to lock in this PLL is the phase angle of the complex number. More specifically, the VCO also has a phase angle for its complex exponential output which we want to phaselock to the incoming signal.

Mathematically, the way this happens is that the VCO carrier frequency and the incoming carrier frequency terms cancel out in the complex multiplication leaving only a small signal $\phi(t)$ to control the VCO frequency. Since the phase of the VCO depends on the integral of $\phi(t)$, $\phi(t)$ must be small when the loop is locked.

One of the features of the CVPLL is that this loop band-width can be higher than the carrier frequency of the signal it is trying to lock to. The reason for this is that the phase detector provides a continuous indication of the phase error without the usual double frequency components of conventional PLLs. The continuous signal from the phase detector continuously corrects the VCO input voltage to produce the correct frequency and phase.

Both the $\Delta\Sigma$ PLLs and the CVPLLs above are forms of broad band PLL capable of rapid acquisition and FM demodulation. The $\Delta\Sigma$ PLLs provide high bandwidth by working in discrete time and oversampling the bandwidth of the modulated signal. The CVPLLs provide high bandwidth by using continuous time feedback to the VCO. In the $\Delta\Sigma$ PLLs, the demodulated FM output comes from the bit stream which can be low pass filtered to recover the original FM modulated signal. In the CVPLLs the demodulated FM output is available from the VCO input.

Although the $\Delta\Sigma$PLLs have the advantage of requiring no precision components, they require extensive filtering in front of the demodulator at the intermediate frequency. The phase response of this filter reduces the linearity of the overall demodulator. It is also expensive to obtain narrow band temperature-stable filters to meet these requirements at higher intermediate frequencies.

The CVPLLs have the advantage of retaining both the amplitude and phase information of the incoming signal. This allows further processing of the signal after it is demodulated. One difficulty for the CVPLL when used in an integrated circuit is that a low noise VCO can be difficult to obtain on chip. A continuous time VCO can also be vulnerable to interference from repetitive or pseudo-random digital signals on the same chip. Another difficulty is that the linearity of the demodulator is limited by the linearity of the VCO tuning characteristic.

SUMMARY OF THE INVENTION

The present invention avoids the shortcomings of the prior art as discussed above by providing a complex valued delta sigma Phase Locked Loop (PLL) demodulator. The demodulator is a multiple stage demodulator. The first stage is a conversion stage which converts an incoming signal into a first complex representation. The second stage is a direct digital synthesizer (DDS)/mixer which synthesizes a signal to be mixed with the first complex signal and performs the mixing operation to produce a second complex output. This second complex signal is controlled by a bitstream fed back from the third stage—a phase quantizer stage. The bitstream represents the quantized phase difference between the synthesized signal and the first complex signal. The DDS/mixer stage then measures the synthesized signal for any phase difference from the incoming signal through the feedback inherent to a PLL, the bitstream thus provides an output that gives the frequency of the desired signal. As a side benefit, the real component of the second complex signal, provides an amplitude estimate of the desired signal.

In a first embodiment the present invention provides a multiple stage frequency demodulator which demodulates an input frequency modulated (FM) signal and produces a bitstream output and the demodulator comprising:

a conversion stage which receives said input signal and which produces a first intermediate complex signal representing the input signal;

a mixer stage which receives said first intermediate complex signal from said conversion stage and said bitstream output as a feedback signal, said mixer stage producing a second intermediate complex signal; and a phase quantizer stage which receives said second intermediate complex signal, said phase quantizer stage producing said bitstream output; wherein said mixer stage performs a discrete phase shift on said first intermediate complex signal, said phase shift being proportional to a value of said bitstream output;

said phase quantizer determines a phase angle of the second intermediate complex signal; and said phase quantizer produces said bitstream output based on whether said phase angle lags or leads the phase of a predetermined signal.

In a second embodiment the present invention provides a Hilbert sampler/filter circuit comprising:

a circuit element having a transconductance;

a plurality of sampler cells, each sampler cell comprising:

a buffer coupled to a transmission switch;

a sampler switch coupled between the circuit element and the buffer;

a capacitor coupled between ground and a first connection point;

a grounding switch coupled between the first connection point and ground; and a second connection point located between the sampler switch and the buffer, said second connection point also being coupled to the first connection point;

wherein for the plurality of sampler cells, only one sampler switch is closed during any one time interval.

In a third embodiment the present invention provides a Hilbert sampler/filter circuit comprising:

a grounding switch;

an array of coupling switches;

a circuit element having a transconductance;

a plurality of sampler cells, each sampler cell being coupled to both the circuit element and the grounding switch at a common node; and a plurality of filter cells; wherein the grounding switch, when closed, couples said circuit element and each sampler cell to ground;

each secondary sampler cell can be cupled to any of the primary sampler cells using the array of coupling switches.

In a fourth embodiment the present invention provides a sampler/filter circuit comprising:

a circuit element having a transconductance;

a plurality of sampler cells, each sampler cell comprising:

an operational amplifier coupled between a first sampler and a second sampler node;

a sampling switch coupled between the circuit element and the second sampler node;

a sampling capacitor coupled between the circuit element and the second sampler node;

a sampling capacitor coupled between the second sampler node and ground;

a pair of primary switches, one primary switch being coupled between a third sampler node and ground and the other primary switch being coupled between a fourth sampler node and ground;

a pair of secondary switches, one secondary switch coupled between the third sampler node and the second sampler node, and the other secondary switch being coupled between the fourth sampler node and the first sampler node;

a filtering capacitor coupled between the third sampler node an the fourth sampler node; wherein the first sampler node is between a sampler cell output and an output of the operational amplifier;

the second sampler node is coupled to the negative input of the operational amplifier;

the positive input of the operational amplifier is coupled to a predetermined reference voltage;

both primary switches are switched simultaneously;

both secondary switches are switched simultaneously.

In a fifth embodiment the present invention provides a sampler/filter circuit comprising at least one pair of sampler cells such that each pair of sampler cells comprising:

a first and a second sampling switch, the first sampling switch being coupled between a first intermediate node and an input and the second sampling switch being coupled between the input and a second intermediate node;

a first and a second operational amplifier, the first operational amplifier being coupled between the first intermediate node and a first output node, the second operational amplifier being coupled between the second intermediate node and a second output node;

a pair of primary sampling capacitors, one primary sampling capacitor being coupled between the first intermediate node and a third intermediate node, the other primary sampling capacitor being coupled between the second intermediate node and a fourth intermediate node;

a pair of secondary sampling capacitors, one secondary sampling capacitor being coupled between the first intermediate node an a fifth intermediate node, the other secondary sampling capacitor being coupled between the second intermediate node and a sixth intermediate node;

a pair of filtering capacitors, one filtering capacitor being coupled between a negative input of the first operational amplifier and the first output node, the other filtering capacitor being coupled between a negative input of the second operational amplifier and the second output node;

for primary switches, each primary sampling switch being placed in the sampler cells such that a primary sampling switch is coupled between ground and each of the third, fourth, fifth and sixth intermediate nodes;

a negator for changing the polarity of a signal, said negator being coupled to the first output node;

four secondary sampling switches, said secondary switches being coupled such that:

a first secondary sampling switch being coupled between the third intermediate node and the first output node;

a second secondary sampling switch being coupled between the fourth intermediate node and the second output node;

a third secondary sampling switch being coupled between the fifth intermediate node and the second output node;

a fourth secondary sampling switch being coupled between the negator and the sixth intermediate node;

wherein the negative input of the first operational amplifier is coupled to the first intermediate node;

the negative input of the second operational amplifier is coupled to the second intermediate node;

the positive input of both operational amplifiers is coupled to ground;

all primary sampling switches are switched simultaneously;

all secondary sampling switches are switched simultaneously.

In a sixth embodiment the present invention provides a direct digital synthesizer/mixer circuit receiving a first intermediate complex signal and a bitstream as input, the circuit comprising:

a frequency synthesizer producing at least one mixer signal having a frequency dependent on the bitstream input;

a mixer which mixes at least one mixer signal to the first intermediate complex signal; where the synthesizer/mixer circuit produces a second intermediate complex signal; and the at least one mixer signal, when mixed with the first intermediate signal, minimizes a phase difference between the first intermediate complex signal and the second intermediate complex signal.

In a seventh embodiment the present invention provides a method of demodulating an input signal to produce a bitstream output, the method comprising:

a) receiving the input signal, b) producing a first intermediate complex signal representing the input signal, said first intermediate complex signal having an inphase component and a quadrature component, c) shifting the phase of the first intermediate complex signal in response to the bitstream output to produce a second intermediate complex signal, d) determining a phase angle of the second intermediate complex signal, e) producing the bitstream output by outputting a specific bit if the phase angle lags or leads a predetermined signal.

In an eighth embodiment the present invention provides a method of sampling an input signal, the method comprising:

a) receiving the input signal at a plurality of sampler cells, each sampler cell having a sampling switch for sampling the input signal;

b) sequentially closing the sampling switch at each sampler cell for a fixed time interval to sample the input signal at different instances; wherein only one sampling switch is closed during any one time interval.

In a ninth embodiment the present invention provides a sampler/filter circuit comprising:

a plurality of sampler cells, each sampler cell comprising:

an operational amplifier coupled between a first sampler and a second sampler node;

a sampling switch coupled between the circuit element and the second sampler node;

a sampling capacitor coupled between the circuit element and the second sampler node;

a sampling capacitor coupled between the second sampler node and ground;

a pair of primary switches, one primary switch being coupled between a third sampler node and ground and the other primary switch being coupled between a fourth sampler node and ground;

a pair of secondary switches, one secondary switch coupled between the third sampler node and the second sampler node, and the other secondary switch being coupled between the fourth sampler node and the first sampler node;

a filtering capacitor coupled between the third sampler node an the fourth sampler node; wherein the first sampler node is between a sampler cell output and an output of the operational amplifier;

the second sampler node is coupled to the negative input of the operational amplifier;

the positive input of the operational amplifier is coupled to a predetermined reference voltage;

both primary switches are switched simultaneously;

both secondary switches are switched simultaneously.

In a tenth embodiment the present invention provides a sampler/filter circuit comprising:

a plurality of sampler cells, each sampler cell comprising:

a buffer coupled to a transmission switch;

a sampler switch coupled between an input and the buffer;

a capacitor coupled between ground and a first connection point;

a grounding switch coupled between the first connection point and ground; and a second connection point located between the sampler switch and the buffer, said second connection point also being coupled to the first connection point;

wherein for the plurality of sampler cells, only one sampler switch is closed during any one time interval.

In an eleventh embodiment the present invention provides a sampler/filter circuit comprising:

a grounding switch;

an array of coupling switches;

a plurality of sampler cells, each sampler cell being coupled to both an input and the grounding switch at a common node; and a plurality of filter cells;

wherein the grounding switch, when closed, couples each sampler cell to ground;

each secondary sampler cell can be coupled to any of the primary sampler cells using the array of coupling switches.

BRIEF DESCRIPTION OF THE DRAWINGS

A better understanding of the invention may be obtained by reading the detailed description of the invention below, in conjunction with the following drawings, in which:

FIG. 1 is a block diagram of a delta sigma phase lock loop according to the prior art;

FIGS. 2(*a*), 2(*b*), and 2(*c*) are different representations of an inphase and quadrature mixer according to the prior art;

DETAILED DESCRIPTION OF THE PREFERRED EMBODIMENTS

Figure 6:
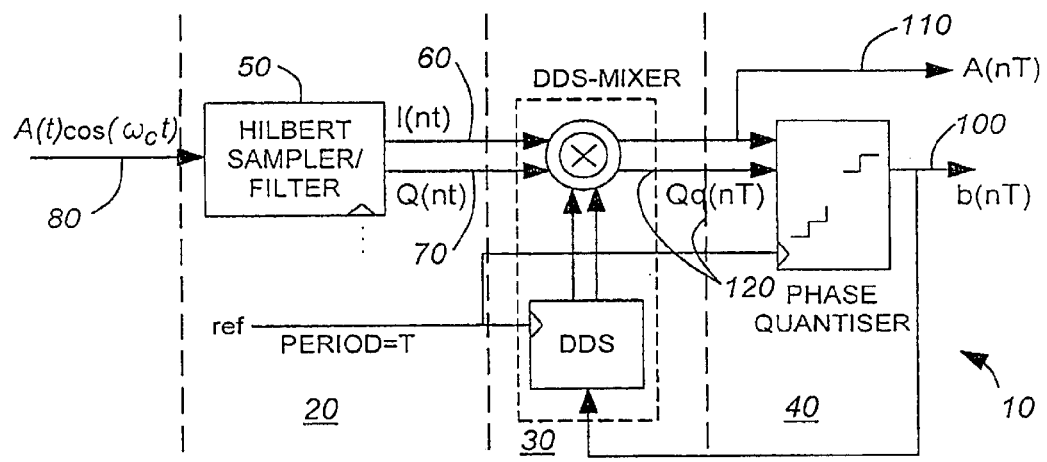
FIG. 6 is a block diagram of a complex valued delta sigma phase locked loop according to an embodiment of the invention.

Referring to FIG. 6, a demodulator 10 according to an embodiment of the invention is illustrated. The three stages of the demodulator are as follows: a conversion stage 20, a mixer stage 30, and a phase quantizer stage 40. In the following description the demodulator 10 will be referred to as a CVΔΣPLL meaning a complex valued delta sigma phase locked loop demodulator. To try to make the description more clear some assumptions are made so that CVΔΣPLL can be described by example. One of these assumptions is that the IF frequency which the CVΔΣPLL is required to demodulate is 45 MHz. Also low side LO frequencies are assumed everywhere. In cases where a resulting second (or third etc.) IF involves a complex signal, it is assumed that the positive rotating exponential is desired rather than the negative rotating exponential. Clearly the functionality and implementation techniques described here apply equally well to other IF or LO frequencies and equally well to negatively rotating exponentials as well as positively rotating exponentials for complex signals.

The CVΔΣPLL obtains and processes amplitude information by using in phase and quadrature samples of the input signal. These provide a complex representation of the input signal as a phasor with Cartesian components. In a preferred embodiment, some sampled signal, $x_1$ has a real and an imaginary part, once it is sampled. Linear filtering can then be performed on these components. Other operations can be performed more "easily" when the signal is treated as a magnitude, $M_1$, and a phase, θ, Since it is ultimately the rate of change of phase (frequency), $f_1$, which we wish to extract from the signal, the CVΔΣPLL can be thought of as a ΔΣ phase locked loop like the previous ΔΣ PLLs with the exception that now the amplitude information is available as an output rather than thrown away at the very front end.

The CVΔΣPLL can be viewed as an extension of existing ΔΣ techniques by adding PLL concepts, or as an extension of existing PLL techniques by using noise shaping and discrete time signal processing. The approach used here to explain the demodulator comes at it from the PLL point of view.

As can be seen from FIG. 6, the CVΔΣPLL consists of:

- a Hilbert Sampler /Filter 50 which provides a complex representation of the continuous time input signal having an inphase 60 and quadrature 70 signals to represent the phasor or complex envelope of the input signal 80.

- a DDS-mixer 90 which performs a discrete phase shift (or rotation in the complex plane) of the input inphase 60 and quadrature signals 70 in response to a bitstream output signal 100 (nT) to produce two signals, A(nT) and Qq(nT), (the amplitude output 110 (A(nt)) and an intermediate complex signal 120 (Qq(nT))

- a phase quantiser which quantises the phase angle of the complex signal A(nT)+j Qq(nT) to produce the bitstream signal b(nT) 100.

The bitstream output 100 is fedback to the DDS-Mixer which corrects the phase of the complex signal A(nt)+j Qq(nT). The phase angle of A(nT)+j Qq(nT) is decreased if the phase signal angle is greater than 0 and increases the phase angle if the phase angle is less than 0.

Figure 3A:
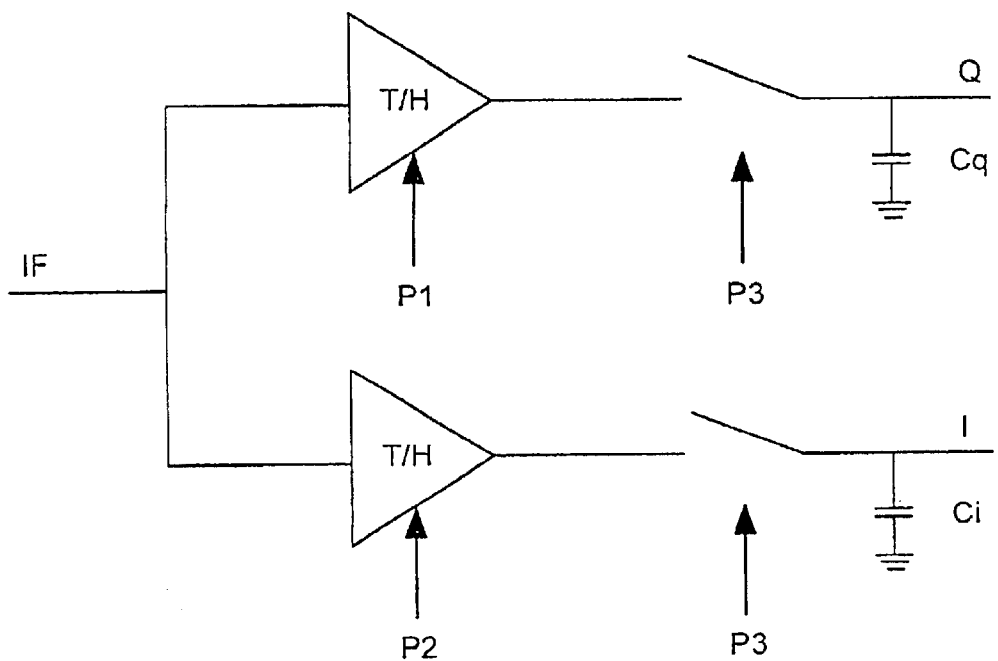
FIG. 3A is a diagram of a track and hold sampler according to the prior art.
Figure 3B:
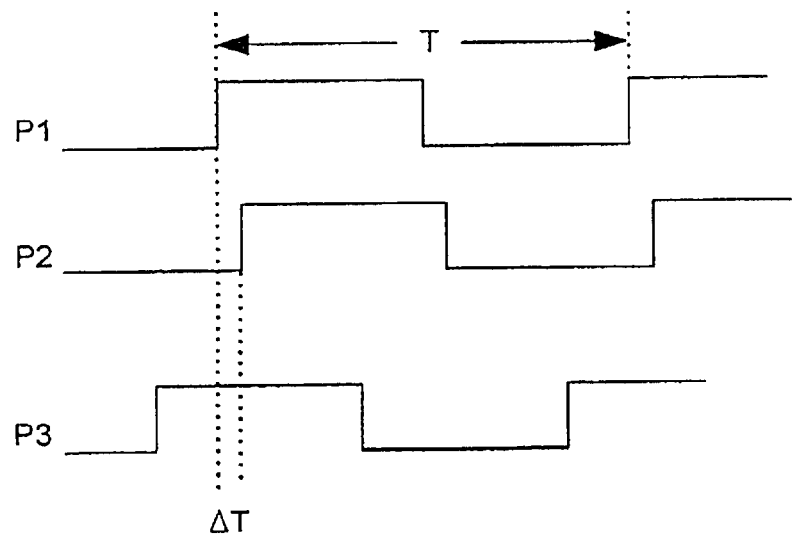
FIG. 3B is a timing diagram for the circuit of FIG. 3A.
Figure 4:
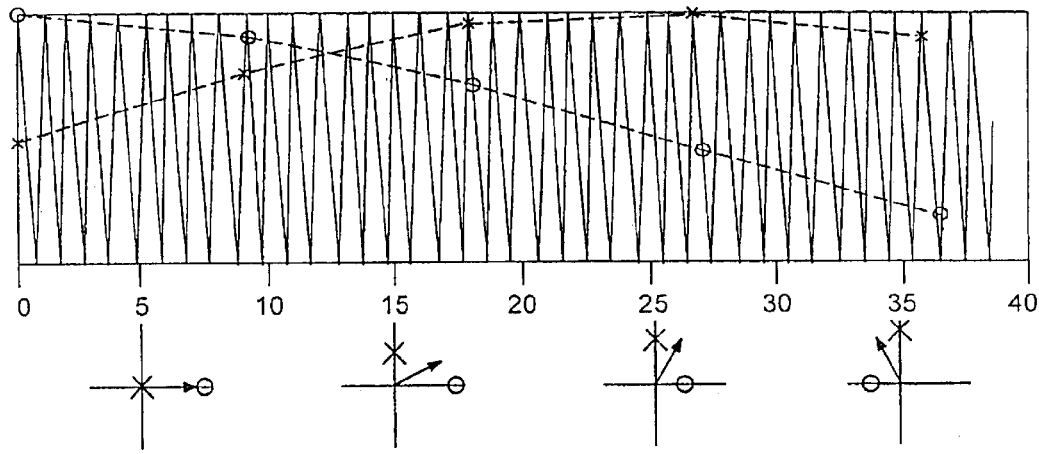
FIG. 4 is a timing diagram for quadrature voltage sampling according to the prior art.
Figure 5:
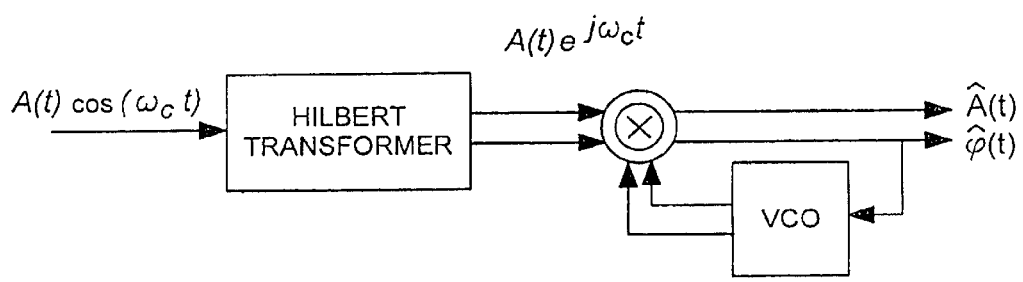
FIG. 5 is a complex valued phase locked loop according to the prior art.

One key feature which distinguishes the CVΔΣPLL from the CVPLL is the use of discrete time analog processing for the quantisation of the phase error and the phase shift introduced by the DDS-mixer. This allows the use of a DDS-mixer combination instead of a continuous time VCO and a mixer combination. The presence of a quantiser also distinguishes the CVΔΣPLL from the CVPLL (FIG. 5).

The feature which distinguishes the CVΔΣPLL from the ΔΣPLL is the use of complex signals to retain both the magnitude and the phase of the input signal or equivalently both the inphase and quadrature components of the input signal.

Within the context of the CVΔΣPLL, there is a wide variation of possible architectures and implementations. These variations, involve variations in the Hilbert Sampler/Filter, the DDS-mixer and the optional use of filtering and/or extra downconversion stages between the DDS-mixer and the Phase-Quantiser.

Variations in the Conversion Stage

The primary function of the Hilbert Sampler/Filter 50 is to provide an in-phase and quadrature representation of the input signal to pass on to the DDS-Mixer. An optional secondary function is to filter undesired signals from the input signal or to filter undesired signals added within the Hilbert Sampler/Filter itself.

The Hilbert Sampler/Filter function can be realized with either:

IQ down-conversion alone,
complex filtering alone,
sampling alone, or
sampling in conjunction with discrete time filtering.

Sampling in the Hilbert Sampler/Filter is not necessary if the subsequent stages, the DDS-Mixer and the phase quantiser, can function with continuous time signals.

In the case of IQ downconversion alone, some low pass filtering would be required to remove the negative frequency components at $-f_{IF}-f_c$. The quality of the in-phase and quadrature match will limit the removal of frequency components at $-f_{IF}-f_c$. This in turn will limit the accuracy of the phase angle of the complex signal intended to describe the IF phasor or complex envelope.

The IQ downconversion could be obtained in very conventional ways. For example, an ECL divide by 4 circuit could be used to divide a 178 MHz reference down to an ($f_c$=44.5 MHz) in-phase and quadrature LO. Then two Gilbert-cell mixers could downconvert the IF signal. The low pass filtering could then consist of just two RC low pass filters to attenuate the frequency components at $-f_{IF}-f_c$. If these parameters do not provide enough attenuation, then the second IF frequency $-f_{IF}-f_c$ could be reduced to a lower frequency, or the order of the filter increased.

Alternatively, if downconversion is not desired to reduce the operating frequencies of the subsequent components in the CVΔΣPLL, then the in-phase and quadrature signals may be obtained by directly filtering the IF signal with a complex filter. By setting the imaginary input to the complex filter to ground and the real input of the filter to the IF signal, we can tell the filter that its input is J+jQ where the imaginary part, Q, is set to zero and the real part, I is the (real) IF signal. The output of the complex filter then provides a complex signal at 45 MHz. The accuracy of the two resulting signals (as a representation of the complex envelope of the input signal) is limited by the matching of the components in the filter.

Another alternative would be to sample the input signal. For any sampling frequency chosen, it is necessary to filter the 45 MHz IF signal to sufficiently anti-alias it before entering the CVΔΣPLL or before the sampling operation occurs within the Hilbert Sampler/Filter.

Other techniques are available to obtain in-phase and quadrature samples. For example, two track and hold amplifiers could be used. By switching the two amplifiers into hold mode at different times, separated in time by a delay equal to ¼ of an IF period, or (n+¼) of an IF period where n is an integer. The track and hold amplifiers must have sufficient bandwidth for the 45 MHz IF signal even if they are sampled at a rate substantially less than 45 MHz. Another example would be to use one track and hold amplifier to produce both the I and Q outputs in a multiplexed stream. Depending on the details of the subsequent components of the CVΔΣPLL, these signals may have to be demultiplexed and/or retimed to be compatible with the other components.

Optionally, discrete time filtering may be used to reduce negative frequency exponentials in the complex representation made by I'+j Q'. Just as a continuous time complex filter can derive in-phase and quadrature signals from a real input signal, a discrete time complex filter can be used to obtain a complex representation of a single sampled signal by suppressing the negatively rotating exponentials. The filtering may also be used to reduce the effects of interfering signals and noise.

Figure 7:
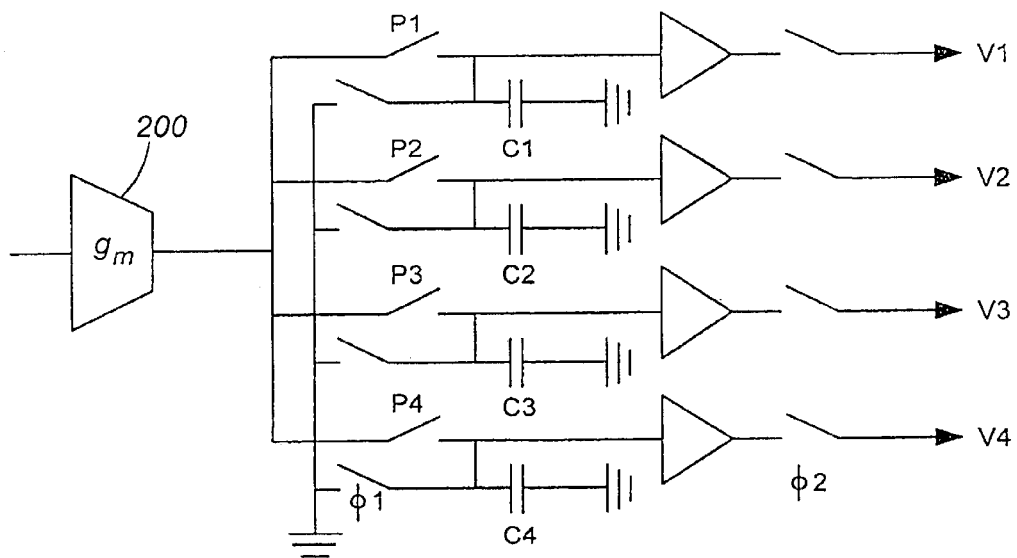
FIG. 7 is a Hilbert Sampler/filter for use with the circuit of FIG. 6 and according to another embodiment of the invention.

However, it is preferred that the conversion stage be a Hilbert Sampler/Filter. FIG. 7 illustrates such a Sampler/Filter. As can be seen, the Sampler/Filter has:

a circuit element 200 with:
a transconductance Gm, resistance or other conversion means to obtain a current proportional to the input IF signal,
a series of sampling phases, P1 . . . Pn, only one of which is high during a predetermined time interval, which provide complex co-efficients of an FIR filter by switching the destination of the current source to one of,
a predetermined number of capacitors, to integrate the current over each of the predetermined time intervals when the current is sent to that capacitor,
a means to transfer the charge, or the information associated with the charge, on some or all of the capacitors to the next stage after the Hilbert Sampler/Filter or to subsequent filter stages within the Hilbert Sampler/Filter.

Figure 8:
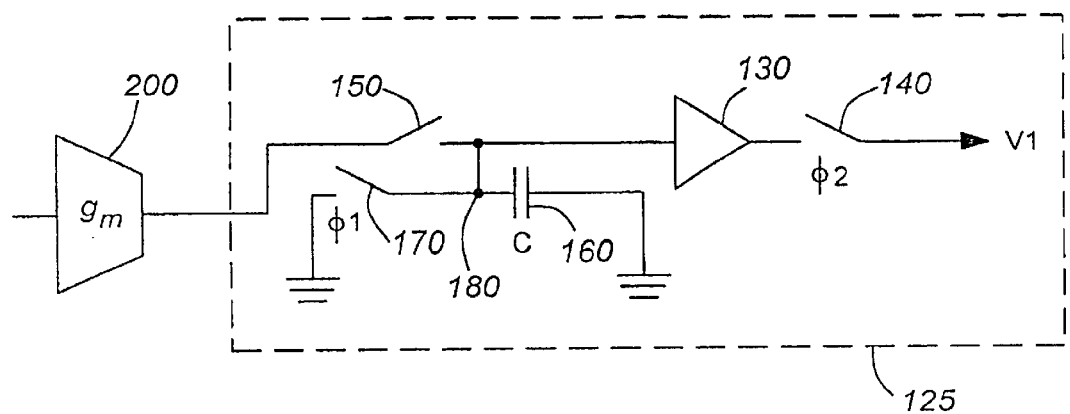
FIG. 8 is a sampler cell of the Hilbert Sampler/Filter of FIG. 7.

The circuit can be generalized as a number of sampler cells, each sampler cell 125 as shown in FIG. 8. As can be seen, each sampler cell has a buffer 130, a data transmission switch 140, a sampler switch 150, a capacitor 160, a grounding switch 170, a first connection point 180. The circuit element 200 with transconductance Gm is coupled to each sampler cell. In FIGS. 7 and 8, $\phi_1$, represents the time the grounding switch 170 is closed. ($\phi_2$, represents the time the data transmission switch 140 is closed.

The key feature of this type of sampler is that the signal is integrated over an entire interval rather than sampled at the end of an interval. By arranging the timing of Ti and Ta (Ti represents the time interval that each of the sampler switches is closed while Ta is the total time interval between the closing of the first sampler switch P1 to the opening of the last sampler switch Pn), each of the phases P1 to Pn can function as complex coefficients of an FIR filter, prior to an ideal sampling. The previously discussed complex filters provided only delay functions, $e^{-snT}$, to form the basis of a filter prior to sampling. Then, by selecting how the samples were used, complex coefficients could be introduced to reduce negative frequency exponentials. The new complex filters provided by this sampler provides an improved filter element $(e^{-s(n+1)T}-e^{-snT})/s$. The phases P1 to Pn can then be used to provide complex coefficients of an FIR filter to reduce negative frequency exponentials prior to sampling.

A simple version of this sampler can be built as shown in FIG. 7. In this simple case, there are only 4 phases and 4 capacitors. Each capacitor voltage integrated during P1, P2, P3 or P4 is buffered with a unity gain buffer and applied to subsequent filtering stages or the DDS mixer during $\phi_2$. The switches clocked on $\phi_1$ and $\phi_2$ and the unity gain buffer are one means of sampling the charge stored in the capacitors and transferring the information to later stages. Other means of transferring this charge to the DDS mixer are discussed later. As part of this scheme, the capacitor voltages are reset to ground during $\phi_1$.

In this, and all examples to follow, it is assumed that only 1 sampler switch is closed during any one time interval. At the detailed circuit design level, switches have finite rise and fall times on the switch control signals. It can be difficult to assure that P2 rises at precisely the same time P1 falls. Further, it may be desirable to have some overlap so that, in this example, P2 rises before P1 falls. Thus, when we say only one sampler switch is closed during any one time interval, this is meant as a first level of understanding only. In practice, the phrase is intended to include embodiments where there is substantial overlap between each sampling interval and the next as well as when there is a gap between time intervals.

Figure 9:
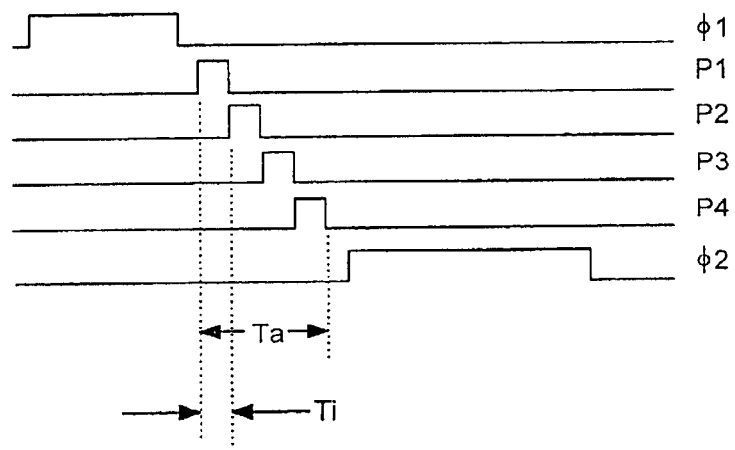
FIG. 9 is a timing diagram for the circuit of FIG. 7 illustrating one possible use of the circuit.

A typical timing diagram might be as follows in FIG. 9. Here, Ta is the aperture time of the sampler, or the time interval over which the sample is made. In this example Ta is included in neither the time when φ1 is active nor the time when φ2 is active. That is, it has its own time slot. In this example, the time slot for Ta occurs between φ1 and φ2. Clearly, many other arrangements are possible, or may be required to adapt to other components used with the sampler.

The Hilbert Sampler/Filter of FIG. 7 may also optionally include repeated sequences of complex tap coefficients. For example, the switch controlling the current to C1 could close two or more times within the aperture time Ta. An example where each switch is closed 3 times is illustrated in the timing diagram of FIG. 10. Keeping Ti constant, Ta increases and the filter becomes more selective.

Figure 11A:
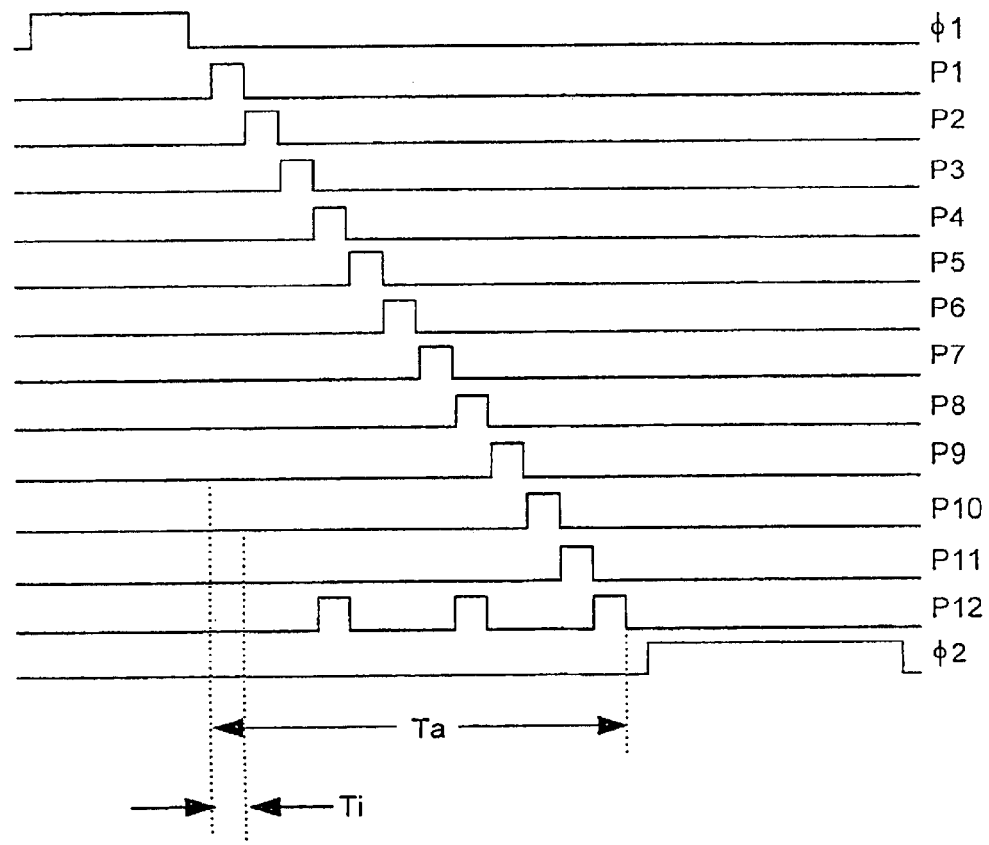
FIGS. 11A and 11B are two possible timing diagrams for a 12 phase extension of the circuit of FIG. 7.

In the previous example there were 4 phases—one for each capacitor. For one capacitor to integrate over 3 time intervals, Ti, each phase went high 3 times. As an alternative, the same function can be provided with n phases, P1 to Pn each of which is high only once during Ta. For example, to achieve the same filter prior to sampling as the previous example, we could pick n=12. Then the timing diagram would be as shown in FIG. 11.

Figure 10:
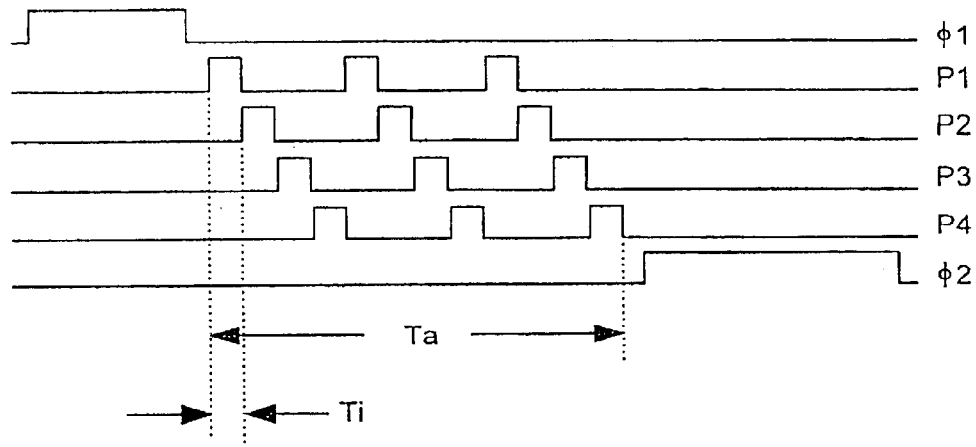
FIG. 10 is a timing diagram illustrating another possible use of the circuit of FIG. 7.

The timing diagram of FIG. 11 can be obtained simply by "unrolling" the timing diagram of FIG. 10. Thus, P1, P5 and P9 in FIG. 11 correspond to the three times the first phase (P1) of FIG. 10 went high.

Now three switches controlled by P1, P5, and P9 control when the current is switched to C1. Clearly the other capacitors receive current in a similar way under the control of the other phases. This arrangement is particularly convenient when Ta is equal to the period, Tr, of some reference clock already available on an integrated circuit for other purposes. Then the phases P1 to Pn can be obtained from a Delay Locked Loop locked to this reference.

Figure 11B:
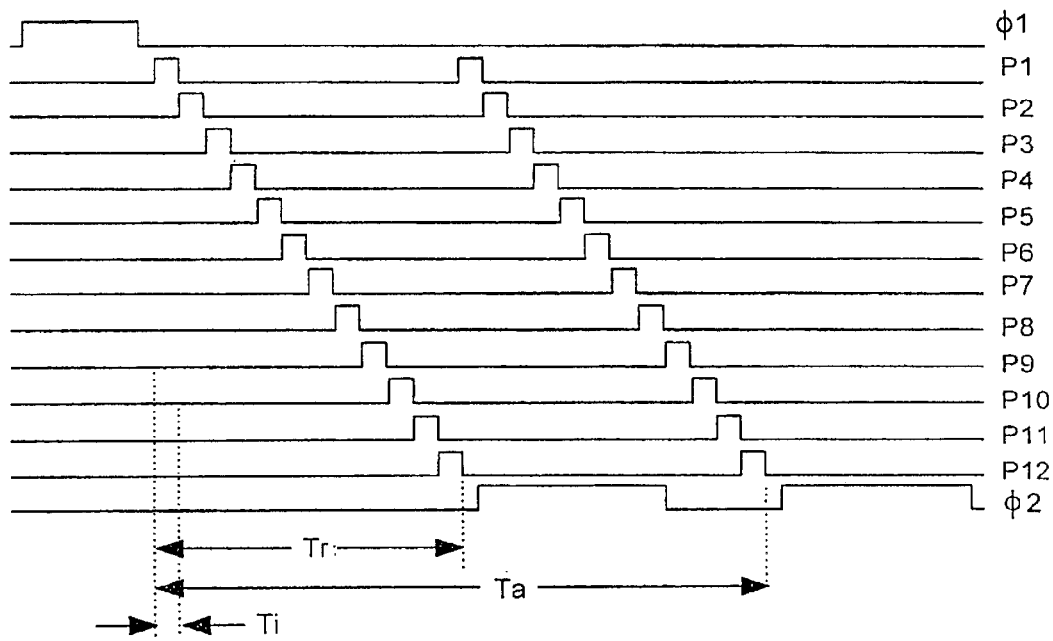

The two techniques may also be combined such that the phases P1 to Pn repeat, for example as shown in the FIG. 11B where Ta=2Tr. Clearly, the approach could be extended to Ta=pTr where p could be more than 2. Also, not all of the available time intervals need to be used. To be even more general, it should be noted that Tr could result from dividing down some higher frequency reference.

Another layer of generality may be added by including some additional logic such that P1 assigns the current to a particular capacitor during one cycle of the reference but to some other capacitor during another cycle of the reference. By also including logic such that the current may be switched directly to ground without going through a capacitor, the phases P1 to Pn can also generate coefficient of value 0 in addition to 1, j, −1 and −j.

So far we have assumed that Ta<Ts where Ts=1/fs is the period of sampling the charge stored onto the capacitors. This restriction may be avoided by using multiple instances of the sampler. By having two or more samplers that are well matched, the sampler can be pipelined such that one sample becomes ready every Ts seconds while the others are in the process of completing their sample. Mismatch in the capacitors or transconductances result in different gains on each of the interleaved samplers. With the voltage-buffer charge sampling means shown in these examples capacitor mismatch causes the same difficulty.

While the above circuit only had four sampler cells, multiple cellular Sampler/filter circuits can easily be constructed. The timing diagrams of FIGS. 11A & 11B can also be applied to a sampler/filter circuit such as that illustrated in FIG. 7 but with twelve sampler cells instead of four. This has the advantage of reducing the quantization step size S.

Figure 12:
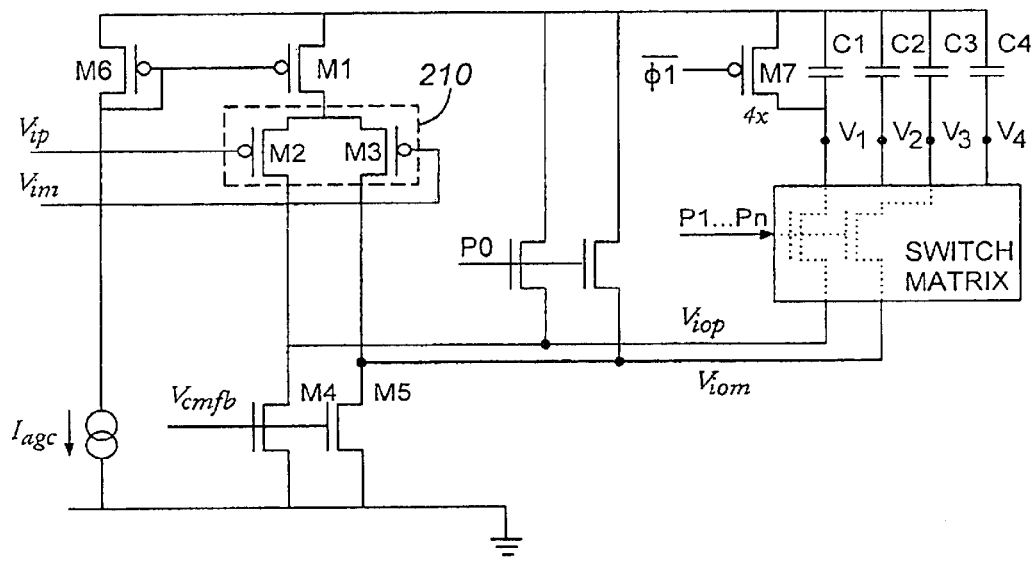
FIG. 12 is a Hilbert Sampler/Filter circuit similar to that of FIG. 7 but implemented using MOS technology.

FIG. 12 illustrates one way to build the transconductance element (200 in FIG. 8) and switches (150 in FIG. 8) in an integrated circuit. FIG. 12 shows a schematic of one way to build the charge sampler in an integrated circuit. In this example, the circuit element 200 is a differential pair 210. The input voltage is applied to a differential pair of MOS transistors whose $g_m$ is controlled by the tail current of the differential pair. This provides an adjustable transconductance $g_m$ which can be used for AGC in the receiver. It also provides a differential current source. Most of the common mode current of this differential pair is then absorbed by a pair of common mode feedback transistors while some of the common mode current and all of the difference mode current is cascoded into either the positive supply or into two of the four capacitors.

The switches of the sampler are provided by NMOS transistors with their gate voltage controlled by the phases P1 to Pn. By setting the high level for P1 to Pn at 2.5 V rather than the 5V supply, a virtual ground is provided to reduce the effects of non-linear output impedance of the current source. To assure that this virtual ground is maintained at all times, a new phase P0 is provided which is high whenever the other phases are not.

This way, the cascode transistors for the folded cascode are also used as switches to determine which load capacitor, if any, gets the difference mode current and residual common mode current. Each load capacitor then integrates the current over the duration of the time that the switches connecting it to the current source are closed. C1 is assigned to represent the inphase channel sample and C3 to represent its compliment (or phase shifted by 180 degrees). Similarly C2 is assigned to represent the quadrature channel and C4 to represent its compliment. Now by arranging the P1 to Pn phases to switch the current into one of the 4 capacitors, the switches can be used to form complex tap coefficients of an FIR filter. If capacitor C1 accumulates a voltage interpreted as the inphase component, any time interval above current is switched to provides a +1 co-efficient for a top of an FIR filter. Similarly, if C2 accumulates the complimentary voltage to C1, time intervals assigned to this capacitor provide −1 top co-coefficient. C3 and C4 can be further used to provide +j or −j coefficient. Coefficients of value 0 can be provided by P0 which shunts the current to the positive supply.

This example does not illustrate the buffer (130 in FIG. 8) and transmission switch (140 in FIG. 8) of each cell. The nodes $V_1$ $V_2$ $V_3$ and $V_4$ correspond to the first connection point (180 in FIG. 8) for each of the four cells.

This example illustrates a four phase sampler, where the complex tap coefficients of the filter are restricted to the set {0, +1, −1, +j, −j}. That is, it can provide tap coefficients of magnitude 0 or 1 where the coefficients of magnitude 1 can have four angles, separated by 90 degrees in the complex plane. The example can be readily extended to provide an 8 phase filter with 8 cells. Then, the 8 cells provide tap coefficients of magnitude 0 or 1 where the coefficients of magnitude 1 can have 8 angles, separated by 45 degrees in the complex plane. Generally, tap coefficients of separation 360/N degrees in the complex plane can be provided by N sampling cells. FIR sampling filters can then be formed by selecting a particular sequence of tap coefficients through the sequence of closing switches in the switch matrix.

In this case, the grounding switches (170 of FIG. 8) are provided by the PMOS transistor M7 (only one of 4 is shown). Each of these shorts a capacitor to ground during $\phi_1$. Ground in this example is the positive supply but in general it can be any predetermined voltage.

A number of issues must be taken into account when using this approach. An adequately accurate phase shift of 180 degrees between Vip and Vim is required. Specifically, common mode voltage fluctuations at 45 MHz should be avoided. The exact relationship between Iagc and the amount of gain control obtained is process dependent.

The current source, Iagc, may be used in a feedback loop developed later in the discriminator which detects the amplitude of the desired signal after filtering. Alternatively it may be a D/A converter. The amplitude of the desired signal should be adjusted to allow overhead for the undesired alternate channel within the linear range of the sampler. This AGC feedback signal could also provide the RSSI signal required in other parts of the receiver.

The voltage source, Vcmfb, is intended to be used as common mode feedback to pin the common mode of the sampled output to a suitable voltage below the positive supply. There are at least two options for developing the CMFB voltage. One option is to force the opamps in the complex resonator to transfer the difference mode charge onto the integrating capacitor without affecting the common mode charge. Another option is to add a second set of sampling capacitors and arrange the switches such that only common mode charge is integrated. In either case, we can be left with a common mode voltage, $V_{cm}$, on a capacitor which can be sampled and used to develop $V_{cmfb}$.

Figure 13A:
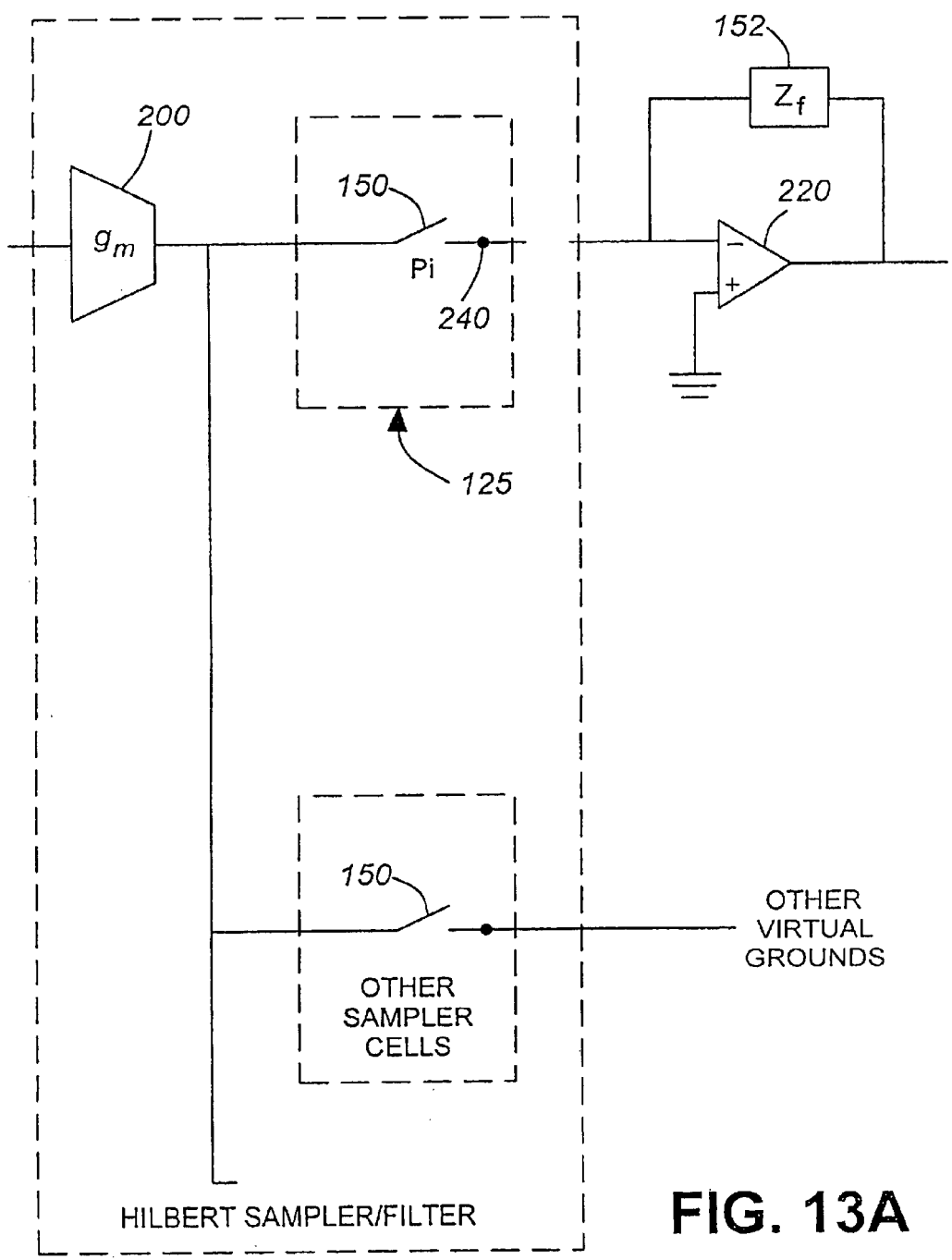
FIG. 13a is a more general version of a Hilbert sampler/filter circuit.

However, the structure of FIG. 8 is not the only way to construct a sampler cell for a Hilbert Sampler/Filter. The sampler cell may also be completed by transferring the charge to a virtual ground 240. This is illustrated by example in FIG. 13a where the virtual ground is formed by an opamp 220 and a feedback impedance 152 placed after the Hilbert Sampler/Filter. Since the transconductance element drives a virtual ground in this embodiment of the Hilbert Sampler/Filter the requirements for output impedance and compliance voltage of the circuit element are reduced. As a result, this is the preferred embodiment of the Hilbert sampler/filter. It comprises: a circuit element having a transconductance and a plurality of sampler cells, each sampler cell comprising a sampler switch coupled between the circuit element and a virtual ground; wherein for the plurality of sampler cells, only one sampler switch is closed during any one time interval.

There are many other virtual grounds available in the literature other than the inverting input of an amplifier. The term virtual ground is intended here to encompass any technique that holds the voltage of the virtual ground close to a predetermined voltage through feedback. This includes techniques such as a cascode transistor where the feedback may be internal to the transistor or external to the transistor through gain boosting.

Just as in the embodiment of FIG. 12, the number of phases in the sampler/filter is determined by the number of sampler cells. Similarly, the number of available tap coefficients and their separation (in degrees) in the complex plane is determined by the number of virtual grounds. Also as with the embodiment of FIG. 12, the sequence of the tap coefficients is determined by the sequence of switch closings.

Similarly to the embodiment of FIGS. 8 and 12, this embodiment of the Hilbert sampler/filter may further comprise a sampler cell coupled between the circuit element and a ground to provide a tap coefficient of value 0.

The Hilbert sampler/filter may also further comprise additional filtering provided by the feedback. For example, if the feedback impedance 152 in FIG. 13a were a resistor in parallel with a capacitor, a real, single-pole low pass filter would be provided in addition to the FIR filter provided by the sampler cells and the circuit element.

Figure 13B:
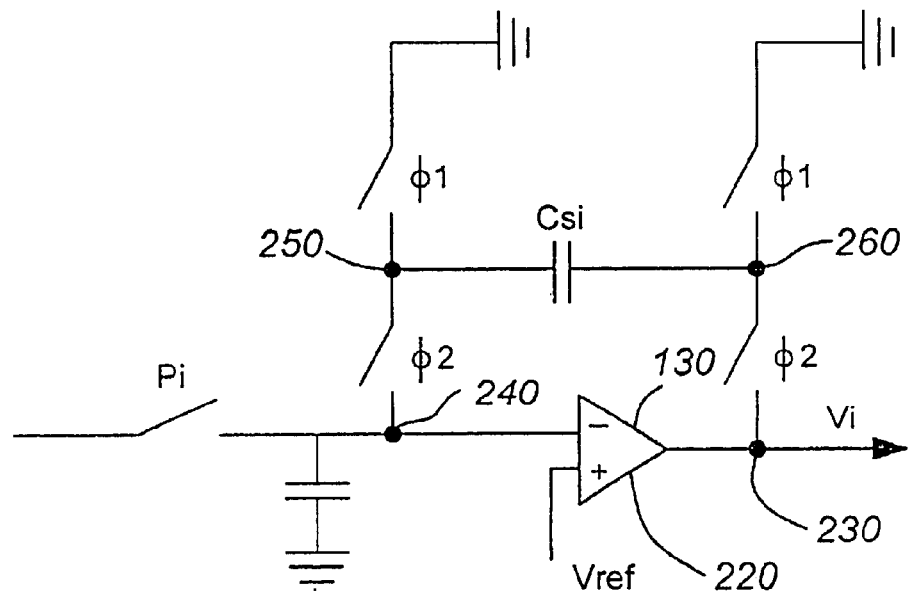
FIG. 13b is a sampler cell according to another embodiment of the invention which can be used in the in the circuit of FIG. 7 in place of the sampler cell of FIG. 8.

FIG. 13b illustrates a sampler cell where this feedback impedance is a switched capacitor resistor.

As can be seen, the sampler cell of FIG. 13 has a sampling switch Pi, a sampling capacitor Ci, a filtering sampling switch Csi, primary switches clocked by $\phi_1$, and secondary switches clocked by $\phi_2$. A first sampler node 230, second sampler node 240m third sampler node 250, and a fourth sampler node 260 are illustrated in the figure.

From the figure, a primary switch clocked by $\phi_1$ is between ground and the fourth sampler node 260. Another, primary switch clocked by $\phi_1$, is between the third sampler, node 250 and ground. The filtering capacitor is coupled between the third (250) and fourth (260) sampler nodes. a secondary switch $\phi_2$ is between the second (240) and third (250) sampler nodes while the other secondary switch $\phi_2$ is between the first (230) and fourth (260) sampler nodes. The operational amplifier 220 is coupled between the second (240) and first (230) sampler nodes. The negative input of the opamp is coupled to the second (240) sampler node while the positive input is coupled to a reference voltage VREF. The sampling switch Pi is between the second (240) sampling node and the cell input. The sampling capacitor Ci is coupled between ground and the second (240) sampler node.

Figure 14:
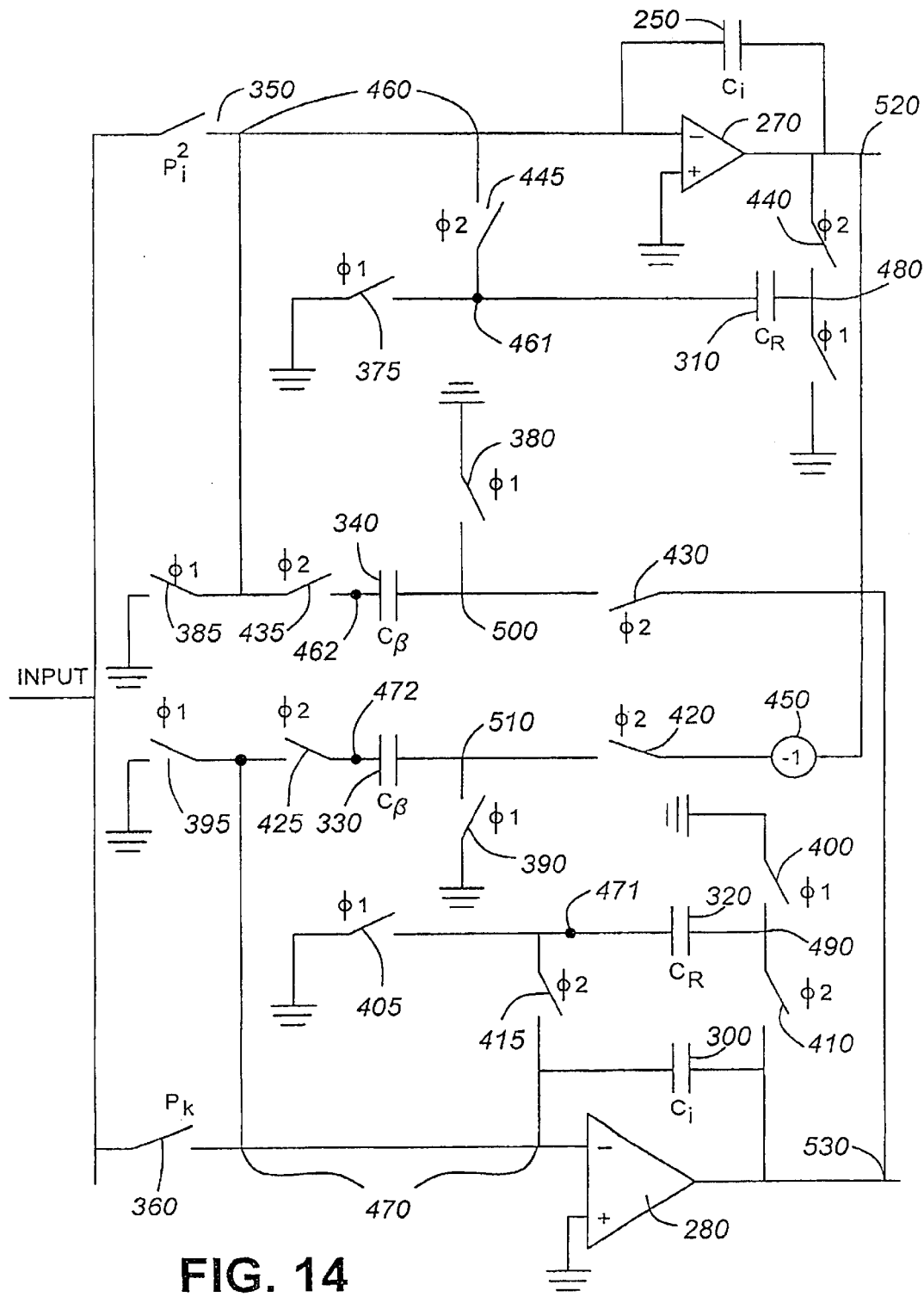
FIG. 14 is a dual cell sampler/filter element according to another embodiment of the invention.

The feedback impedance may also be made complex by the circuit shown in FIG. 14. The pair of sampler cells in FIG. 14 have a phase separation of 90 degrees. That is one represents an inphase component and the other a phase shifted version of the complex signal. Traditionally the phase shift between the two is 90 degrees so that the other component is a quadrature component but with more than two phases other phase shifts are possible. Clearly, the single pole filter shown in FIG. 14 could be extended to a biquad or cascode of biquads using well known techniques commonly applied to discrete time filtering.

FIG. 14 illustrates a pair of sampler cells. The pair of cells have a pair of operational amplifiers 270, 280, a pair of filtering capacitors Ci (290, 300), primary sampling capacitors 310, 320 (Cr), secondary sampling capacitors (Cp), 330, 340, a first sampling switch 350 for the first cell and a second sampling switch 360 for the second cell. Also shown in the diagram are eight primary sampling switches 370, 375, 380, 385, 390, 395, 400, 405 and eight secondary sampling switches 410, 415, 420, 425, 430, 435, 440, 445. Also included in the pair of sampler cells is a negator 450. For ease of description, a number of nodes are also identified:

first intermediate node 460 second intermediate node 470 third intermediate node 480 fourth intermediate node 490 fifth intermediate node 500 sixth intermediate node 510 a seventh intermediate node 461 an eighth intermediate node 471 a ninth intermediate node 462 a tenth intermediate node 472 along with a first output node 520 (the output of opamp 270, and a second output node 530 (the output of opamp 280).

The first sampling switch 350 is between the input to the cell pair and the first intermediate node. The second sampling switch 360 is between the input to the cell pair and the second intermediate node. The first intermediate node is coupled to the negative input of the opamp 270. The second intermediate node is coupled to the negative input of the opamp 280. Both positive inputs of the two opamps 270, 280 are coupled to ground. Each of the filtering capacitors 290, 300 are coupled across the negative input of an opamp and the output of the same opamp.

Coupled between the seventh intermediate node 460 and the third intermediate node 480 is a primary sampling capacitor 310. Similarly, the second primary sampling capacitor 320 coupled between the eighth intermediate node 471 and the fourth intermediate nodes 490. The secondary sampling capacitors 340 is coupled between the ninth intermediate node 462 and the fifth intermediate node 500. The other secondary sampling capacitor 330 is coupled between the tenth intermediate node 472 and the sixth intermediate node 570.

Concerning the primary and secondary sampling switches, the eight primary sampling switches are each coupled between ground and one of the following nodes: the third, fourth, fifth, sixth, seventh, first, second and eighth intermediate nodes. Of the eight secondary sampling switches, one (410) is coupled between the second output node 530 and the fourth intermediate node. Similarly, another (440) is coupled between the 3rd intermediate node and the first output node 520. Another (switch 430) is coupled between the fifth intermediate node 500 and the second output node 530. Another secondary sampling switch 420 is coupled between the sixth intermediate node 510 and the negator 450. The negator 450, in turn is coupled between the secondary sampler switch 420 and the second output port 520. The fifth secondary sampler switch 445 is coupled between the seventh and the first intermediate node. Another secondary sampler switch (435) is between a primary sampler switch (385) and the ninth intermediate node. a further secondary sampler switch (425) is between another primary sampler node (395) and the tenth intermediate node. The final secondary sampler switch 415 is between the second intermediate node and the eighth intermediate node.

Figure 15:
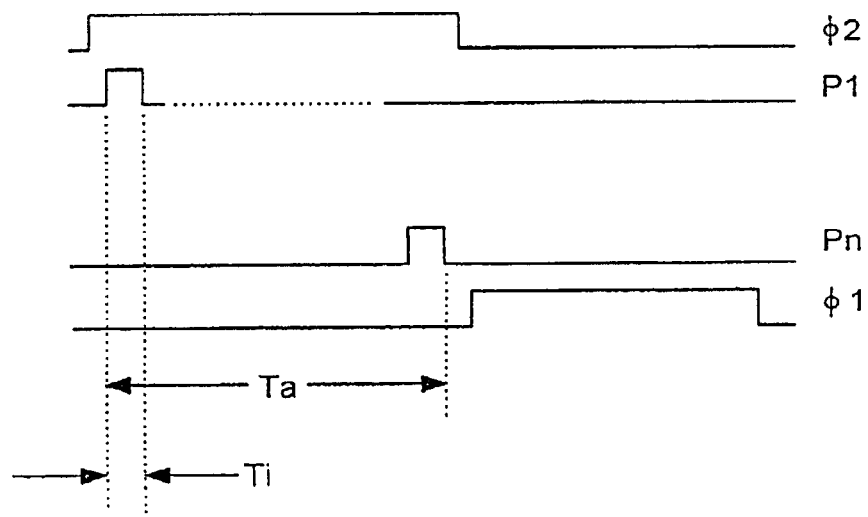
FIG. 15 is a possible timing diagram for the circuit of FIG. 14.

In the circuit of FIG. 14, the sampling capacitors are $C_R$ and $C_\beta$. The phases P1 to Pn may be contained within one of the switched capacitor phases. Alternatively, Ta may occur during one of the switched capacitor phases. The circuit of FIG. 14 can be clocked with the timing indicated in FIG. 15 to show an example where Ta occurs during φ1. With this arrangement of the timing, the current source can drive a virtual ground.

The circuit of FIG. 14 is shown single ended for clarity; it may be better to use differential circuitry with common mode feed-back. Then, P3 would provide the compliment of P1, P4 would provide the compliment of P2 in a phase example. The technique can be readily extended to more phases.

Another means of transferring charge from the sampler is to use passive switched capacitor techniques. This can also be used to provide additional filtering The absence of opamps may make the passive approach more linear and more suitable to low voltage applications. In this case, the means of transferring charge out of the sampling capacitors is simply a series of switches connecting the capacitors to the next stage of the Hilbert Sampler/Filter or the DDS-Mixer.

Figure 16:
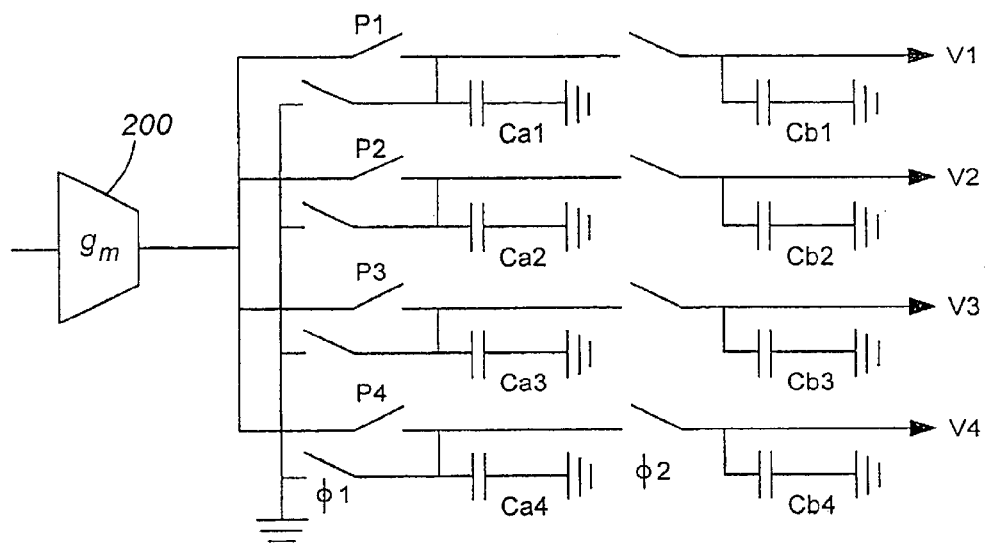
FIG. 16 is a sampler/filter circuit similar to the circuit of FIG. 7 but with a passive filter after each sampler cell.

An example is shown in FIG. 16. In this case charge balance equations on any one of the output voltages give $$V(z) = \frac{1}{C_T} \frac{1}{1 + yz^{-1}} Q_i(z) \text{ Where } C_T = C_a + C_b \text{ and } Y = C_b/C_r.$$

Thus, each pair of $C_a$ and $C_b$ capacitors forms a single pole real filter. Now if each of these filters match the others, we have the same filter applied to each of the I and Q channels as well as there compliments. Under these conditions we have the equivalent of a real filter applied to a complex signal.

Complex filtering may be provided in many ways to improve the rejection of negative frequency exponentials.

It should be noted that the circuit of FIG. 16 is similar to that of FIG. 7. However, each sampler cell of FIG. 16 has an extra filtering capacitor ($Cb_x$) after the sampler switch φ2.

The concepts embodied in the sampler/filter illustrated so far may be extended to apply to a new type of discrete time complex filter which is made up of:

an information sampling means which can sample three or more phase-shifted versions of the input signal, shifted uniformly through 360 degrees in the complex plane, producing three or more corresponding phases;

one or more groups of information storage means where each individual information storage means in a group stores information for each phase of the sampling means and provides a value to represent this information;

optionally, a means of transferring information from one group to the next and finally to an output group if there is more than one group.

one or more groups of information sharing means for sharing information between the previous time value of each phase and a rotating phase-shifted version of the previous-time value of each phase; and a means to pass some or all values of the output group to other circuits.

The filter has been described here in very abstract terms because it could provide a discrete-time digital filter as well as a discrete-time analogue filter, The discrete-time digital filter (and the discrete-time DDS-Mixer to follow) could be used after A/D conversion in a digital filter built of adders and multiplexers or with fixed point DSP in a microprocessor. Either of these options would require some intelligent noise shaping approach to round off error.

Figure 17:
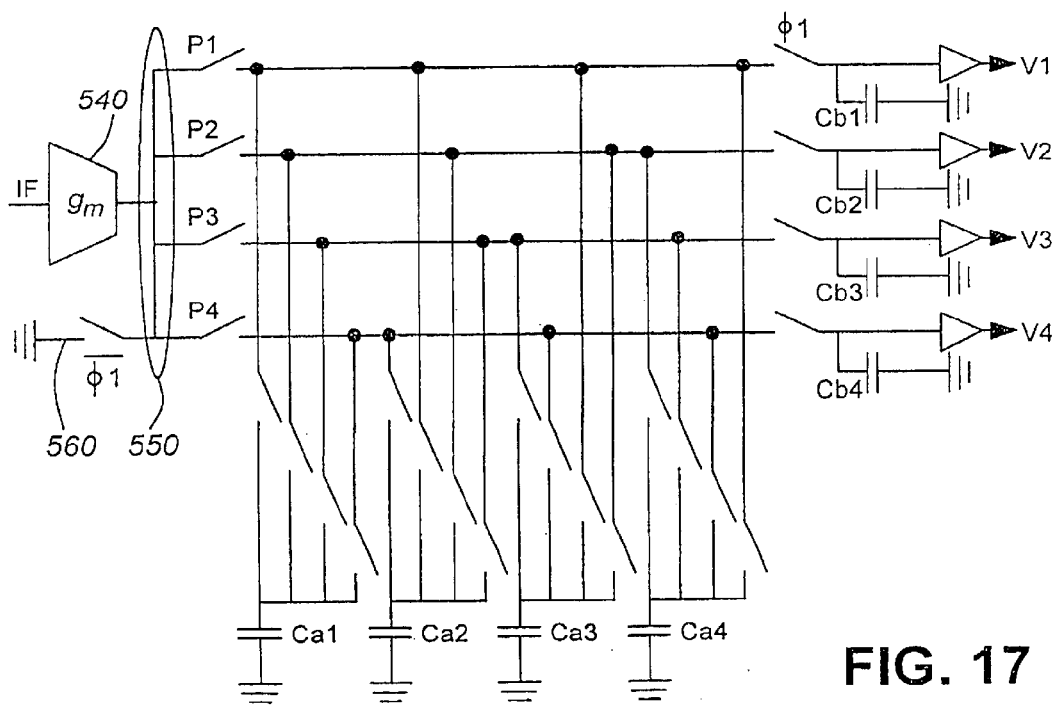
FIG. 17 is a sampler/filter circuit according to another embodiment of the invention which can use the concept of rotating capacitors to sample and filter a signal.
Figure 18:
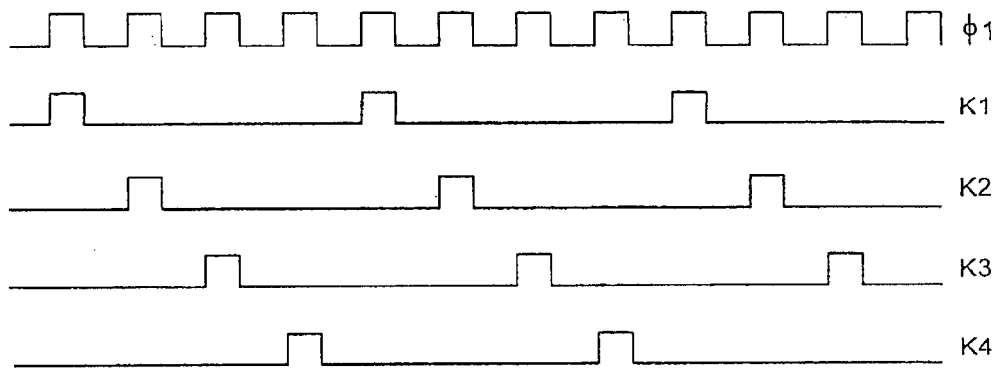
FIG. 18 is a timing diagram for the switches in the circuit of FIG. 18.

One example of an analogue four-phase 1-group filter is shown in FIG. 17. In this case the information sampled is charge sampled by integrating current over the time intervals P1 to P4. The information storage means are each equally weighted capacitors of the $C_b$ group of capacitors. The information sharing means are each equally weighted capacitors of the $C_a$ group of capacitors, the switch control signals K1 to K4 and the switches operating under the control of K1 to K4. The phases K1 to K4 are arranged to be active during the time when φ1 is active and to have the same duration as φ1 Each of these phases K1 to K 4 have a period of 4 times the period of φ1 and are phased such that only one of them is active at any one time so that each Cb capacitor is connected to one $C_a$ capacitor during φ1, as illustrated in the timing of diagram of FIG. 18.

As can be seen from FIG. 17, the sampler/filter circuit can be viewed as a collection of primary sampler cells, each of which can be connected to a collection of secondary sampler cells. A circuit element 540 with a transconductance Gm is coupled at a common node 550 to a grounding switch 560 which is, in turn, coupled to ground. The common node 550 couples each of the primary sampler cells to the circuit element 540.

Figure 19:
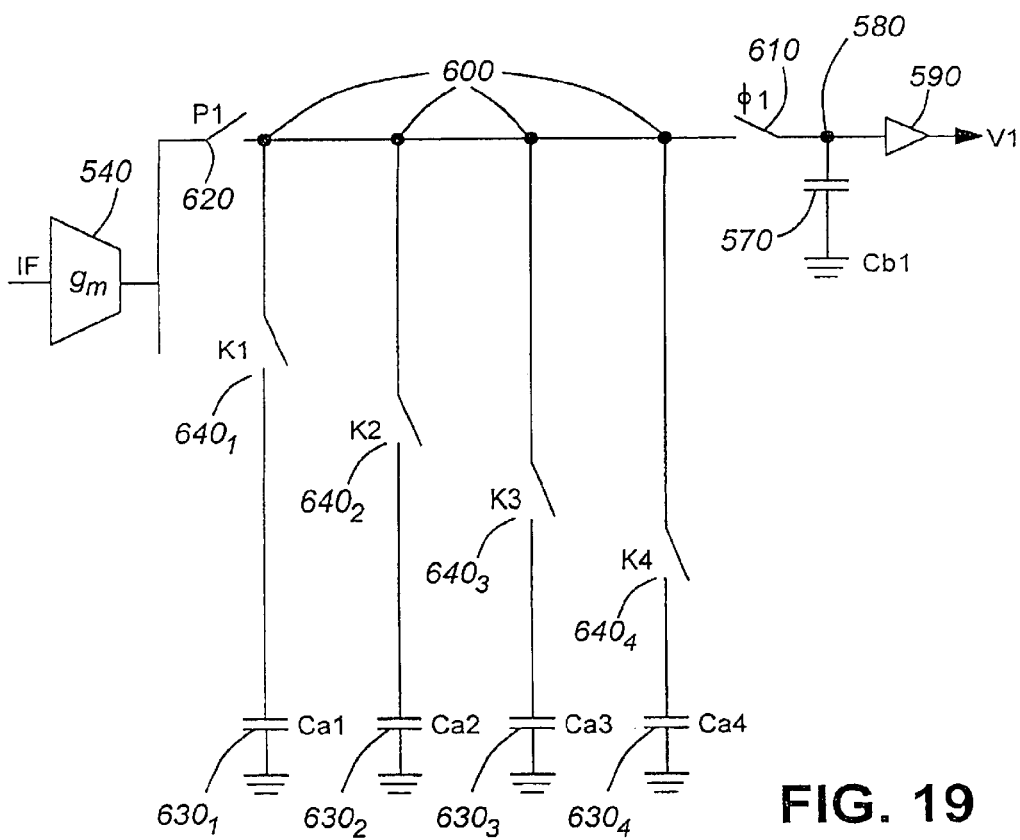
FIG. 19 is a sampler cell of the circuit of FIG. 17.

FIG. 19 illustrates a single primary sampler cell coupled to four secondary sampler cells. As can be seen from FIG. 19, a first capacitor 570 (Cb1) is coupled between ground and a first connection node 580. Between the node 550 and a primary sampler cell output V1, is a buffer 590. Between the node 570 and a second connection node 600 is an activation switch 610 (φ1).

Between the node 600 and the circuit element 540 is a sampling switch 620 (P1). Coupled to the node 600 are the secondary sampling cells. Each of these secondary sampling cells are coupled to the node 600 by an array of coupling switches. Each secondary cell is composed of a second capacitor $630_1$, $630_2$, $630_3$, $630_4$, coupled between ground and a corresponding coupling switch, $640_1$, $640_2$, $640_3$, $640_4$. By closing one of these coupling switches, any one of the second capacitors can be coupled to the primary sampler cell. Between FIGS. 17 and 19, it should be clear that any one of the secondary sampler cells can be coupled to any one of the primary sampler cells.

The key feature illustrated in this passive filter is that one set of capacitors rotates relative to another set of capacitors. For example, in FIG. 17 capacitor $C_{b1}$, is connected to capacitor $C_{a1}$ then to $C_{a2}$, $C_{a3}$, $C_{a4}$, and back to $C_{a1}$. This process repeats indefinitely. The point of this arrangement is that on each connection, φ1, the $C_{b2}$ capacitor is connected to a $C_a$ capacitor which was previously connected to $C_{b2}$. Thus on every connection phase, a charge sharing operation occurs between the previous voltage V1 and the previous voltage V2 through the capacitors $C_{b1}$ and one of the $C_a$ capacitors.

Any of the sampler/filter circuits discussed above, and their equipments or extensions, can be used for the conversion stage of the CVΔΣPLL demodulator.

Variations on the Mixer Stage

Since the CVΔΣPLL demodulator needs to mix and phase lock to a specific frequency, PLL concepts call for a signal to mix the incoming signal with. Experience and experiments dictate that a direct digital synthesizer (DDS) provides the best results for the CVΔΣPLL. Thus, in the following discussion, the mixer stage will be referred to as a DDS-Mixer.

It should be noted that, as the conversion stage produces 2 signals, the inphase and the quadrature representations of the demodulator input, the DDS-Mixer receives both these signals.

The primary function of the DDS-mixer is to provide discrete phase shifts of the output of the Hilbert Sampler/Filter. These phase shifts respond to the output of the Phase Quantiser to provide a negative feedback adjusting the phase of the DDS-mixer output toward some predetermined value. An accumulation means, typically a digital phase accumulator, (DPA) responsive to the output bit stream, b(nT), integrates the bit stream to provide a state, θ, which indicates the required degree of phase shift for the input signal, $X_{Os}=I+jQ$. The mixer part of the DDS-mixer provides an output $X_{r1}=A+jQq$ such that $X_{r1}=X_{os}e^{-jθ}$. A wide variety of circuits to accomplish this are presented in the literature and are known to those versed in the art.

Figure 20:
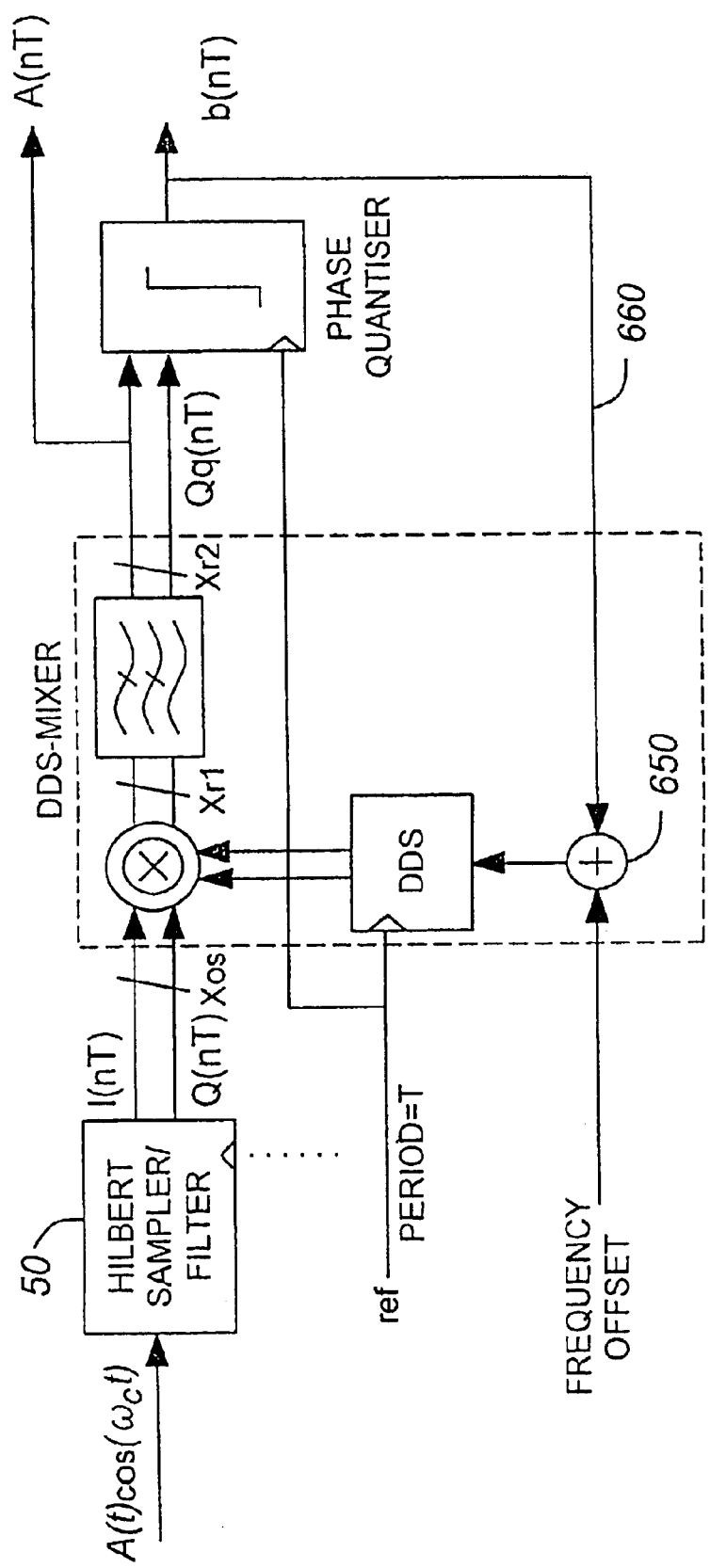
FIG. 20 is a demodulator with a frequency offset and a bandpass filter incorporated in the mixer stage.

The DDS-Mixer may also provide a frequency offset control. When this is provided, additional frequency offsets may be removed from the Hilbert Sampler/Filter output. FIG. 20 shows an example where a digital adder 650 is used to add the frequency offset control to the bit stream, b(nT) 660. In cases where the digital phase accumulator (DPA) provides a separate carry input for the LSB and the bit-stream, b(nT), is a single bit bit-stream, the frequency offset control can consist of applying a frequency offset control word to the main DPA input and the bit-stream to the carry input of the DPA.

The DDS-Mixer may also optionally provide additional filtering to provide a filtered output, $X_{r2}(nT)=A(nT)+jQq(nT)$ This filtering provides reduction of undesired signals present in the original IF input, or reduction of undesired signals introduced by the DDS-Mixer or Hilbert Sampler/Filter. Generally, this filtering could be either real or complex.

Figure 21:
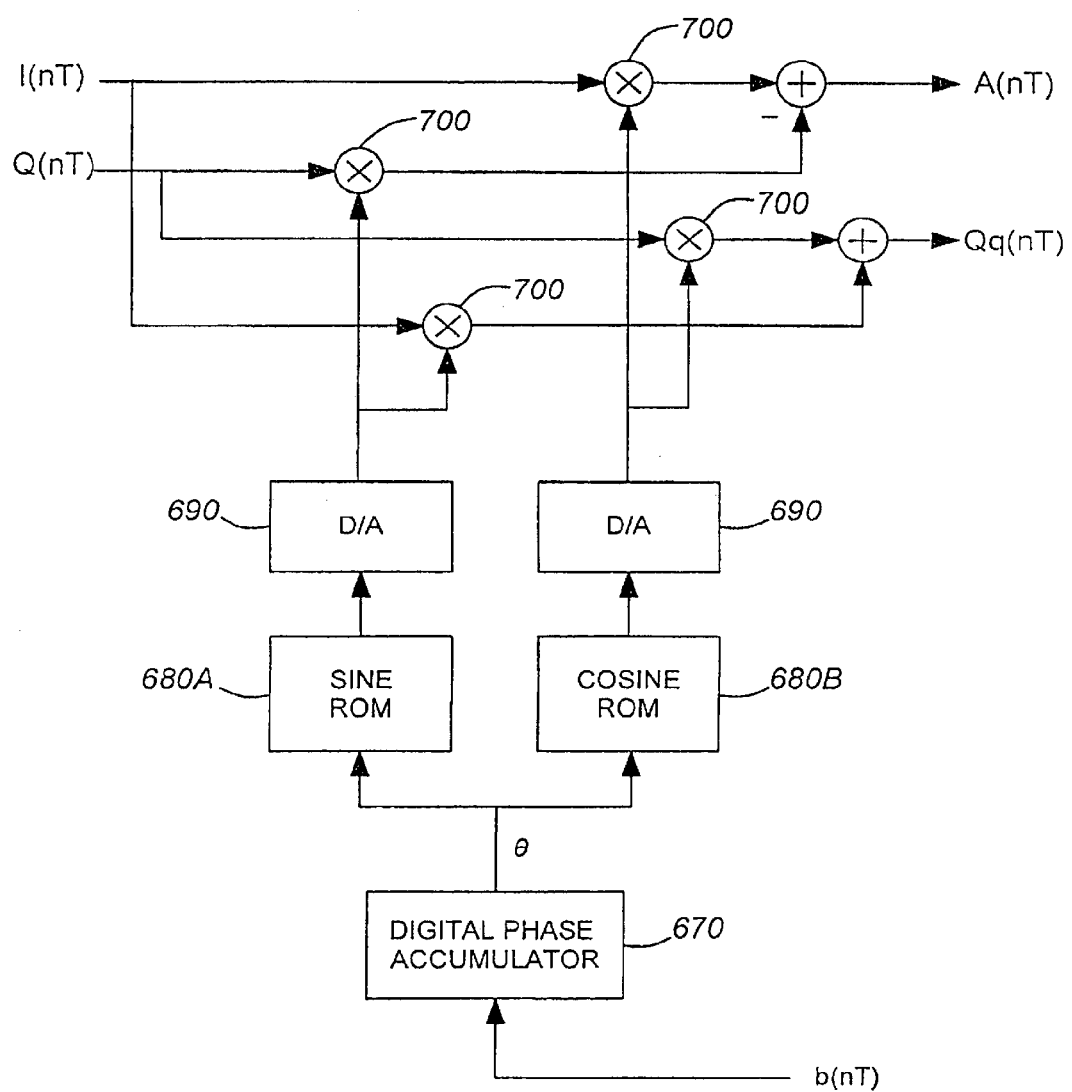
FIG 21 is an example of a mixer stage implementation using a digital phase accumulator.

A simple implementation of the DDS/mixer combination is presented in FIG. 21. In a conventional DDS the input frequency is accumulated in a phase accumulation register 670, to provide a value, θ, representing the DDS phase. The output phase is then passed to a sine 680A and cosine 680B lookup ROM to provide the complex output after a pair of D/A converters 690. In the simple implementation, each of the sampled inputs would then have to be multiplied by the real and imaginary outputs from the DDS. The four quadrant multiplication mean 700 could then take the form of a Gilbert cell multiplier or some other equivalent. Clearly this implementation would be complicated. The lookup ROMS and mixers can be replaced with switched capacitor circuits.

When three or more phases of the Sampled sign are available, a DDS mixer with a phase resolution corresponding to the number of available phases can be produced through the mixing properties of the switch matrices discussed for filtering.

As with the DDS-Mixers previously described, an accumulator responsive to the output bit stream, b(nT), integrates the bit stream to provide a state, θ, which indicates the required degree of phase shift for the input signal, $X_{os}=I+jQ$. Two approaches to making the switches have been identified. One approach is to have a digital decode and dedicated switches. That is for example, a 16×16 switch, can be made up of 256 individual switches of which 16 at a time can be turned on to connect 16 phases on one side of the switch to 16 phases on the other side of the switch with the desired degree of rotation controlled by digital logic. Alteratively, the switches may be connected in series to perform the decoding directly from the state of a digital phase accumulator. Combinations of the two approaches are, of course, also possible.

One method of implementing the DDS-Mixer with additional filtering uses switched capacitor techniques as described. To simplify the DDS, its resolution is reduced to 4 bits or 16 possible states. As a result, θ can take on only 16 possible values. In the example presented here, θ is accumulated in a digital phase register (as in a conventional DDS) however the value in the phase register is used to directly select one of 16 possible phase shifts of the sampled signal. This avoids the need to implement the ROMs D/As and mixers.

Mathematically, we wish to generate $$X_{r1}=A'+jQ'_q$$

from the input signal $$X_{os}=I+jQ$$

which is provided by the Hilbert Sampler/Filter
That is we want $$X_{r1}=X_{os}e^{-jθ}$$

and pass this to the opamp rather than the original sampled signal. In terms of real and imaginary parts, the above expression becomes $$Re(X_{r1})=Re(X_{os})\cos θ - Im(X_{os})\sin θ$$

$$Im(X_{r1})=Re(X_{os})\sin θ + Im(X_{os})\cos θ$$

With the quadrature sampler, phase shifts of π/2 or multiples of π/2 are easily performed by swapping and/or inverting the in-phase and quadrature samples. In this way the two MSBs of the 4 bit DDS/mixer can be implemented with only switches. The remaining 2 bits require phase shifts of multiples of $\pi/8$. These can be arranged through capacitor ratios shifting only a portion of the charge between the sampler's in-phase and quadrature channels. The above equation suggests that maybe the sampled charge (on each channel) could be divided into two portions; for example on the in-phase channel, a portion of the charge proportional to $\cos \theta$ would remain on the in-phase channel while a portion of the charge proportional to $\sin \theta$ would be passed to the quadrature channel. While this suggestion is true, it turns out that it cannot be implemented with two capacitors because, in general, $$\sin^2(\theta) + \cos^2(0) = 1 \text{ and } |\sin(\theta)| + |\cos(\theta)| \neq 1.$$

This causes difficulties because the total charge sampled onto only two capacitors cannot be divided up into two portions proportional to $\cos \theta$ and $\sin \theta$ for all values of $\theta$. As a result, a third capacitor, $C_{i3}$ and $C_{q3}$ is needed on each of the in-phase and quadrature channels as shown in FIG. 22.

Figure 22:
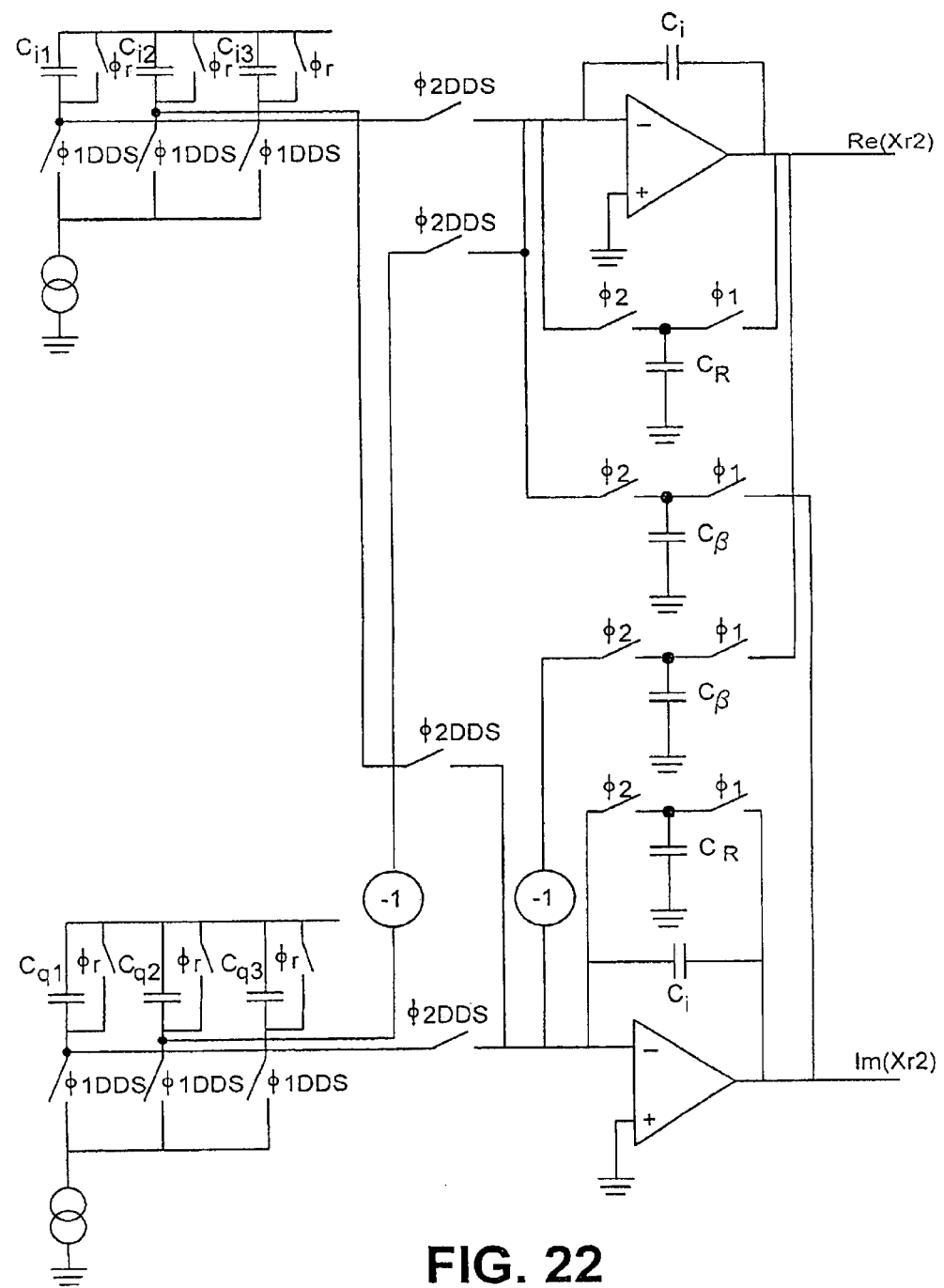
FIG. 22 is another exampler of a mixer stage implementation which includes passive filtering.

In FIG. 22, the practice of showing the circuit single ended is used again for clarity and simplification. Here the transconductance is shown as a simple current source switched onto the load capacitors for a period $\phi_{is}$. In this scenario, we sample a charge, Q, onto $C_{i1}$, $C_{i2}$, and $C_{i3}$. Since the same voltage occurs across the three capacitors, the charge in the capacitors is $$Q_i = Q_i \frac{C_{1i}}{C_T} + Q_i \frac{C_{2i}}{C_T} + Q_i \frac{C_{3i}}{C_T}$$

and similarly for the quadrature channel, $$Q_q = Q_q \frac{C_{1q}}{C_T} + Q_q \frac{C_{2q}}{C_T} + Q_q \frac{C_{3q}}{C_T}$$

Both of these sampled charges together can be expressed in complex notation as, $Q_s = Q_i + jQ_q$. The switches active during $\phi 2$ can then be arranged such that the charge passed on to the opamp during $\phi 2$ $$Q_{as} = \left( Q_i \frac{C_{1i}}{C_T} - Q_q \frac{C_{2q}}{C_T} \right) + j \left( Q_q \frac{C_{1q}}{C_T} - \frac{C_{2i}}{C_t} \right)$$

Now by selecting $$\frac{C_{1i}}{C_T} = a\cos\theta$$

$$\frac{C_{2q}}{C_T} = a\sin\theta$$

$$\frac{C_{1q}}{C_T} = a\sin\theta$$

$$\frac{C_{2i}}{C_T} = a\cos\theta$$

we have $$Q_{as} = \alpha[(Q_i \cos \theta - Q_q \sin \theta) + j(Q_q \sin \theta - Q_i \cos \theta)]$$

which gives $$\frac{C_3}{C_T} = 1 - a(\cos\theta + \sin\theta)$$

These equations can be solved for each value of $\theta$. Then the phase, $\theta$, stored in the digital accumulator can be digitally decoded to switch the appropriate set of sampling capacitors into the sampler. Thanks to symmetry in the quadrants, there will only be four sets of capacitors to switch for this 16 phase example.

Since $C_3$ contains a charge that will be thrown away, it represents a signal loss and we would like to keep it as small as possible in every case for $\theta$ The smallest value for $C_3$ occurs when $\theta$ is a multiple of $\pi/2$. When $\Theta = \pi/4$, $$\cos\theta = \sin\theta = \frac{1}{\sqrt{2}} \text{ which in turn gives } a = \frac{1}{\sqrt{2}}$$

FIG. 22 shows a simplified version of the sampler-DDS/Mixer-Filter combination. It is simplified in several ways. As with the previous filter schematic, it is shown as a single ended circuit where it is intended to be differential. The sampler operation has been simplified to a switched current source where $\phi_{Is}$ represents the cascode switches discussed in the previous section. The digital phase accumulator of the DDS is not shown, and the decode logic to generate $\phi_{IDDS}$ or $\phi_{2DDS}$ is not shown. Further, the switches and capacitors are shown for only one of 16 possible phase shifts of the DDS/Mixer.

The operation of what is shown is as follows: The sampler is initialised by closing $\phi_{IDDS}$ and switching in a set of 6 capacitors, $C_{i1}$, $C_{i2}$, $C_{i3}$, $C_{q1}$, $C_{q2}$ and $C_{q3}$, during $\phi$. In this set, $C_{i1} + C_{i2} + C_{i3}$ is equal to $C_1$ in the previous section on the sampler. Switching this capacitor set in during $\phi$ allows any charge injected by this switching operation to be shunted to ground. Then with the particular set of capacitors switched into the sampler, $\phi$, opens and initialisation of the sampler is complete. During $\phi_{Is}$, a charge is sampled onto this set of capacitors. The set of capacitors is chosen by the two LSBs of the digital phase accumulator and perform a phase shift of some amount less than $\pi/2$. This can be seen by imagining that if $C_{i1} = C_{q1} > C_{i2} = C_{q2}$, most of the signal sampled onto C, passes on to the filter with a small phase shift; while if $C_{i1} = C_{q1} < C_{i2} = C_{q2}$, most of the signal gets shifted by $\pi/2$. That is, more of the signal sampled on the in-phase channel gets shifted to the real channel and more of the signal sampled on the real channel gets shifted to the quadrature channel. Four such sets of capacitors and switches could then provide four discrete phase shifts within one quadrant of the mixer. The net result is that at the end of $\phi$, the complex sample is phase-shifted by an amount determined by the two LSBs of the digital phase accumulator.

FIG. 22 shows the application of this phase-shifted sample to the filter during $\phi_{2DDS}$. In the example shown, this phase-shifted charge sample is transferred onto the integrating capacitors, $C_1$ by the opamps. The one quadrant phase-shift built into the sampler can be extended to the other three quadrants by having four sets of switches for $\phi_{2DDS}$ which connect the sampled charge to the filter in different configurations. Specifically, for another $\pi/2$ phase-shift, $\phi_{2DDS}$ could swap the $C_1$ with the $C_q$, which a long with an appropriate inversion of one of the channels could be arranged to add another $\pi/2$ of phase shift to the complex sample. Alternatively, an extra phase shift of n could be arranged by inverting both in-phase and quadrature samples. The net result of the one quadrant 4 position phase-shift during $\phi_1$ and the four quadrant 4 position phase shift during $\phi_2$ is a 4 quadrant 16 position phase-shift which is under the control of the digital phase accumulator. This is the equivalent of a DDS and a complex mixer as desired.

Additional downconversion stages may be added after the DDS-Mixer. There are two major cases in this PLL analysis. In the first case, we will have a preliminary look at a "Heterodyne Loop" which has been described, for conventional PLLs, in other sources. Application of the heterodyne loop to a CVΔΣPLL is also advantageous. In the second case, we will look at the "1Long Loop" concept which can be applied advantageously to the CVΔΣPLL.

Figure 23:
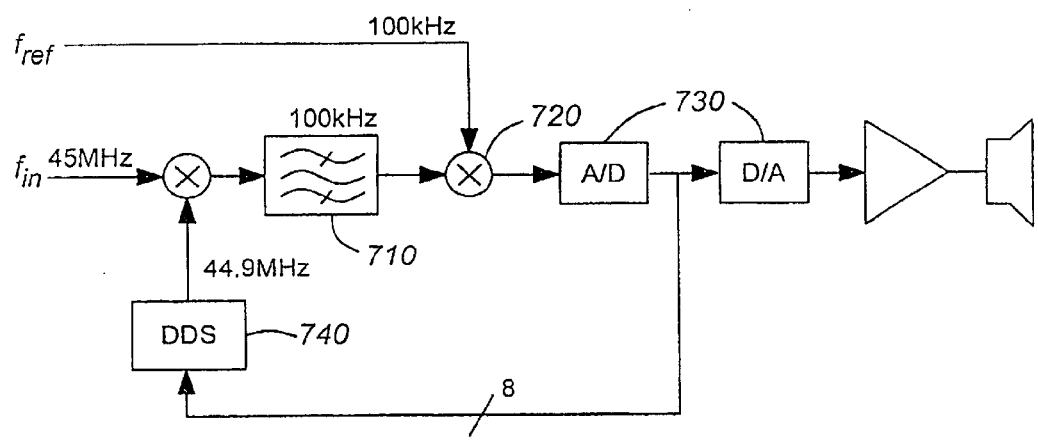
FIG. 23 is a diagram of a heterodyne PLL.

A high resolution version of a demodulator is shown in FIG. 23. This PLL when used with a VCO has been called a "Heterodyne Loop" by others. Its operation is as follows: The input frequency $f_{in}$ from the conversion stage is mixed with the output of a Direct Digital Synthesizer (DDS) to some IF frequency. For example, the 45 MHz first IF we wish to demodulate is mixed to a second IF near 100 kHz, where it is band-pass filtered (710). This 100 kHz second IF is then compared 720 to a 100 kHz reference frequency and phase detected. The detected phase error is then A/D converted and used to drive the DDS, locking the loop. If the loop is to remain phase locked, the signal driving the DDS must represent the input frequency (with a 100 kHz IF offset). Thus, if we had an 8 bit A/D/D/A pair 730 and an 8 bit DDS 740 with a 44.9 MHz output frequency most of our problems would be solved, but at the expense of considerable power consumption.

Figure 24:
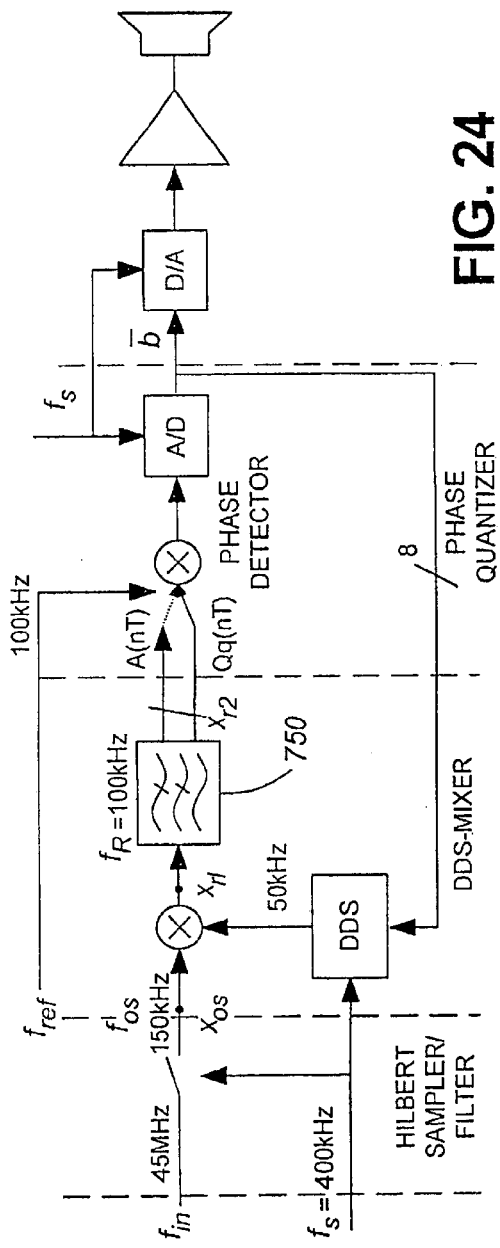
FIG. 24 is a diagram of a subsampled heterodyne PLL according to an embodiment of the invention.

The first step towards power reduction is to sub-sample the 45 MHz first IF to produce in phase and quadrature samples at the clock frequency for the DDS and the A/D, which is $f_s$, as shown in FIG. 24. The sub-sampling should not cause noise or other aliasing problems if an off-chip IF filter has sufficient selectivity and stop band attenuation to anti-alias the first IF signal. To be more specific, the IF filter must attenuate noise and interference more than ½ the sub-sampling frequency away from the IF to the point where it is insignificant. If we pick the sub-sampling frequency to be 44.85 MHz/112 which is near 400 kHz, the sub-sampling then aliases the 45 MHz first IF to a second IF at 150 kHz. Mixing this IF with the DDS 740, which is producing a 50 kHz output, then produces a third IF at 100 kHz, which is the band pass filter 750 as shown. Under these conditions, the DDS clock can be reduced from over 90 MHz in the previous example to only 400 kHz here. This results in the demodulator of FIG. 24.

For now we can ignore the details of how to perform the sampling operation and consider the sequence of samples, χas, at 400 kHz to be the input to the demodulator. These samples can be thought of as complex since they contain both amplitude and phase information in their I and Q components. The demodulator of FIG. 24 is also a heterodyne PLL with a reduced input frequency at 150 kHz, sampled at 400 kHz. Its method of operation requires a phase lock which can only occur under certain conditions. The conditions for this demodulator to lock are simply that the frequency output from the band-pass filter must match the reference frequency. In order for this to occur, the input frequency minus the frequency generated by the DDS must equal both the centre frequency of the band pass filter and the reference frequency. The frequency output from the DDS is, $$\frac{\bar{b}}{R_{DDSI}} f_s(A)$$

where b is the average output of the A/S converter and $R_{DDSI}$ is the resolution of the DDD so the constraint becomes $$f_{as} - \frac{\bar{b}}{R_{DDSI}} f_s = f_r = f_{ref}$$

where $f_{as}$ is the input offset frequency we wish to receive, $f_R$ is the centre frequency of the band pass filter, and $f_{ref}$ is the reference frequency. A numerical example of this lock condition may help to illustrate the meaning of equation A and the operation of the loop. If we consider a simple case where there is no modulation on the original 45 MHz carrier and nQ interference, then the input frequency, $f_{os}$, is a single tone at 150 kHz, and the output of the loop, should be a fixed dc value corresponding to this input frequency. With a reference frequency of 400 kHz, and a resolution of $R_{DDS1}$= 256 that is 8 bits, the average input to the DDS which will produce a 50 kHz DDS output with a 400 kHz clock is $$\bar{b} = \frac{50 \text{ kHz}}{400 \text{ kHz}} 2^B = 32$$

If the output of the A/D is less than 32, then the DDS output frequency will be less than 50 kHz. This will cause a frequency error (i.e. a ramp in phase error) at the 100 kHz phase detector. This will in turn correct the A/D output until it is 32. This way the loop always corrects itself to satisfy the lock condition of equation (12). Now, if we allow the input to have some FM modulation, it is fairly easy to imagine that the PLL can track this modulation by adjusting the A/D output number. That is, the loop can be identified as a frequency-to-digital frequency discriminator.

Another approach to the above, is the "Long PLL". In this PLL we generate two phase locked loops which establish two simultaneous constraints on the frequency of the lock condition. As a result of these two simultaneous constraints there is only one offset frequency and corresponding b which can satisfy the phase-lock conditions, and then if the loop is properly designed, the PLL either locks to the assigned channel or does not lock. The result of this extra constraint is that the filtering of the band pass filter is always used to attenuate the alternate channel.

Figure 25:
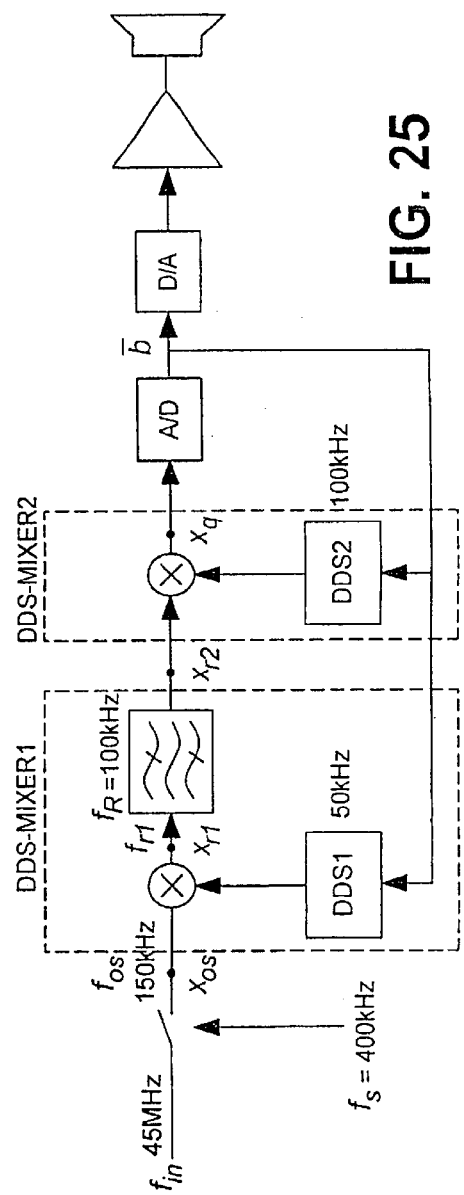
FIG. 25 is a diagram of a long loop demodulator with multiple mixer substages and according to an embodiment of the invention.

The "Long Loop" is illustrated in FIG. 25. Its first mixer (DDS-Mixer) is similar in operation to the "Heterodyne Loop" previously discussed. One difference from the Heterodyne Loop is that the signal at the band pass filter output is no longer phase locked to a fixed reference. Instead it is phase locked to another DDS whose frequency also depends on the A/D output. This sets up a more complicated set of constraints for the loop to lock, which we can now analyze.

As in the "Heterodyne Loop" previously discussed, this first mixer gives a constraint on frequencies that can pass through the resonator without attenuation.

$$f_{as} - \frac{\bar{b}}{R_{DDSI}} f_s = f_{RI}$$

Similarly the second DDS/mixer combination (DDS-Mixer 2) mixes the IF frequency down to dc. Unlike the "Heterodyne Loop" previously discussed, the reference frequency which mixes the IF frequency down to dc is now dependent upon the output of the A/D converter. Now the second DDS/mixer combination gives the constraint $$f_{RI} - \frac{b}{R_{DDS2}} f_s = 0$$

Solving these two constraints for $f_{as}$ by eliminating b gives $$f_{as} = f_{RI}\left(\frac{R_{DDS1}}{R_{DDS2}} + 1\right)$$

Now by picking the resolution of the two DDS accumulators, and the resonant frequency of the resonator, the demodulator can be constrained to receive only the assigned channel, even if it is weaker than the alternate channel.

After the last (or only) DDS/mixer combination, the signal is finally downconverted to dc and held in phase lock to 0 Hz. This is accomplished by quantising the complex phase angle of $x_q(nT)=A(nT)+j\ Qq(nT)$. Since the signal is complex, the quantiser can determine the phase of the complex voltage, $x_q(nT)$. In general, this would require a transcendental function to perform $\tan^{-1}(\text{Im}(x_q)/\text{Re}(x_q))$. One approach along these lines is to perform an A/D conversion of both $A(nT)$ and $Qq(nT)$. Then a lookup table could table could perform a inverse tangent to obtain a quantised phase angle.

However, in the case of a single bit phase quantiser, we only want to know if $x_q(t)$ is leading or lagging. The situation is simplified by the fact that $\text{sign}(\tan^{-1}(\text{Im}(x_q)/\text{Re}(x_q)))=\text{sign}(\text{Im}(x_q))$ and as a result simply quantising the imaginary part of $x_q$ tells if the phase is leading or lagging, assuming that interference have not corrupted the decision. If the phase of the signal being quantised is leading, a one is produced by the quantiser; if it is lagging, a zero is produced. Only this bit stream from the quantised phase information is used for feedback in the phase locked loop. Negative feedback in the PLL then holds this imaginary component close to 0. Since we have quantised this error signal to a single bit, the PLL is also a $\Delta\Sigma$ loop and same residual quantisation noise is present throughout the PLL.

Since the phase locking $x_q$ holds the imaginary component close to 0, the magnitude of $x_q$ is in the real component, $A(nT)$. This component is ignored for the PLL but can be conveniently used in an AGC loop or as received signal strength indicator (RSSI).

A person understanding the above-described invention may now conceive of alternative designs, using the principles described herein. All such designs which fall within the scope of the claims appended hereto are considered to be part of the present invention.

The embodiments of the invention in which an exclusive property or privilege is claimed are defined as follows:

1. A multiple stage frequency demodulator which demodulates an input frequency modulated (FM) signal and produces a bitstream output and the demodulator comprising:
    a conversion stage which receives said input signal and which produces a first intermediate complex signal representing the input signal;
    a mixer stage which receives said first intermediate complex signal from said conversion stage and said bitstream output as a feedback signal, said mixer stage producing a second Intermediate complex signal; and
    a phase quantizer stage which receives said second intermediate complex signal, said phase quantizer stage producing said bitstream output;

wherein
    said mixer stage performs a discrete phase shift on said first intermediate complex signal, said phase shift being proportional to a value of said bitstream output;
    said phase quantizer determines a phase angle of the second intermediate complex signal; and
    said phase quantizer produces said bitstream output based on whether said phase angle lags or leads the phase of a predetermined signal.

2. A demodulator as in claim 1 wherein said conversion stage comprises:
    a divider circuit which divides a reference signal into inphase and quadrature reference signals;
    a pair of Gilbert cell mixers receiving said inphase and quadrature reference signals and said input signal, to produce inphase and quadrature downconverted signals; and
    at least one pair of filtering circuits said filtering circuits attenuating specific frequency components of said inphase and quadrature downconverted signals to produce said first intermediate complex signal.

3. A demodulator as in claim 1 wherein said conversion stage comprises a complex filter circuit.

4. A demodulator as in claim 1 wherein said conversion stage comprises:
    at least two track and hold amplifiers; and
    a timer circuit for switching said amplifiers into hold mode at different times.

5. A demodulator as in claim 1 wherein said conversion stage comprises a Hilbert sampler/filter circuit said sampler/filter circuit substantially performing a Hilbert transform on the input signal.

6. A demodulator as in claim 5 wherein said conversion stage comprises:
    a circuit element having a transconductance;
    a plurality of sampler cells, each sampler cell comprising:
        a buffer coupled to a transmission switch;
        a sampler switch coupled between the circuit element and the buffer;
        a capacitor coupled between ground and a first connection point;
        a grounding switch coupled between the first connection point and ground; and
        a second connection point located between the sampler switch and the buffer, said second connection point also being coupled to the first connection point;
wherein for the plurality of sampler cells, only one sampler switch is closed during any one time interval.

7. A demodulator as in claim 5 wherein said conversion circuit comprises:
    a grounding switch;
    a circuit element having a transductance;
    a plurality of primary and secondary sampler cells, each sampler cell being coupled to both the circuit element and the grounding switch at a common node;
    a plurality of filter cells each filter cell being coupled to a primary sampler cell; and
    and an array of coupling switches for coupling any one of said primary sampler cells with any one of said secondary sampler cells,
wherein
    the grounding switch, when closed, couples said circuit element and each sampler cell to ground.

8. A demodulator as in claim 7 wherein each primary sampler cell comprises:

a buffer coupled between a primary sampler cell output and a first connection node;

a first capacitor coupled between ground and the first connection node;

a sampling switch coupled between the circuit element and a second connection node;

an activation switch coupled between the second connection node and the first converter node;

wherein said array of coupling switches is coupled to each primary sampler cell at the second connection node;

the state of the grounding switch is always opposite to the state of the sampling switch.

9. A demodulator as in claim 8 wherein each secondary sampler cell comprises a second capacitor coupled between ground and the array of coupling switches, said array of coupling switches comprising at least one coupling switch coupled between the second capacitor of a secondary sampler cell and a second connection node of a primary sampler cell.

10. A demodulator as claimed in claim 5 wherein said conversion stage comprises:

a circuit element having a transductance;

a plurality of sampler cells, each sampler cell comprising:

an operational amplifier coupled between a first sampler hole and a second sampler node;

a sampling switch coupled between the circuit element and the second sampler node; -a sampling capacitor coupled between the circuit element and the second sampler node;

a sampling capacitor coupled between the second sampler node and ground;

a pair of primary switches, one primary switch being coupled between a third sampler node and ground and the other primary switch being coupled between a fourth sampler node and ground;

a pair of secondary switches, one secondary switch coupled between the third sampler node and the second sampler node, and the other secondary switch being coupled between the fourth sampler node and the first sampler node;

a filtering capacitor coupled between the third sampler node an the fourth sampler node;

wherein the first sampler node is between a sampler cell output and an output of the operational amplifier;

the second sampler node is coupled to the negative input of the operational amplifier;

the positive input of the operational amplifier is coupled to a predetermined reference voltage;

both primary switches are switched simultaneously;

both secondary switches are switched simultaneously.

11. A demodulator as in claim 5 wherein said conversion stage comprises at least one pair of sampler cells such that each pair of sampler cells comprises:

a first and a second sampling switch, the first sampling switch being coupled between a first intermediate node and an input and the second sampling switch being coupled between the input and a second intermediate node;

a first and a second operational amplifier, the first operational amplifier being coupled between the first intermediate node and a first output node, the second operational amplifier being coupled between the second intermediate node and a second output node;

a pair of primary sampling capacitors, one primary sampling capacitor being coupled between the first intermediate node and a third intermediate node, the other primary sampling capacitor being coupled between the second intermediate node and a fourth intermediate node;

a pair of secondary sampling capacitors, one secondary sampling capacitor being coupled between the first intermediate node an a fifth intermediate node, the other secondary sampling capacitor being coupled between the second intermediate node and a sixth intermediate node;

a pair of filtering capacitors, one filtering capacitor being coupled between a negative input of the first operational amplifier and the first output node, the other filtering capacitor being coupled between a negative input of the second operational amplifier and the second output node;

four primary switches, each primary sampling switch being placed in the sampler cells such that a primary sampling switch is coupled between ground and each of the third, fourth, fifth and sixth intermediate nodes;

a negator for changing the polarity of a signal, said negator being coupled to the first output node;

four secondary sampling switches, said secondary switches being coupled such that:

a first secondary sampling switch being coupled between the third intermediate node and the first output node;

a second secondary sampling switch being coupled between the fourth intermediate node and the second output node;

a third secondary sampling switch being coupled between the fifth intermediate node and the second output node;

a fourth secondary sampling switch being coupled between the negator and the sixth intermediate node;

wherein the negative input of the first operational amplifier is coupled to the first intermediate node;

the negative input of the second operational amplifier is coupled to the second intermediate node;

the positive input of both operational amplifiers is coupled to ground;

all primary sampling switches are switched simultaneously;

all secondary sampling switches are switched simultaneously.

12. A demodulator as claimed in claim 1 wherein the mixer stage comprises:

a frequency synthesizer producing at least one mixer signal having a frequency dependent on the bitstream output;

a mixer which mixes said at least one mixer signal to the first intermediate complex signal;

where the at least one mixer signal, when mixed with the first intermediate complex signal, minimizes a phase difference between the second intermediate complex signal and the first intermediate complex signal.

13. A demodulator as in claim 12 wherein said frequency synthesizer includes a digital phase accumulator, said phase accumulator integrating the bitstream output to produce an indication of a required phase shift to minimize the phase difference between the second intermediate complex signal and the first complex intermediate signal.

14. A demodulator as in claim 12 wherein the mixer stage further includes a bandpass filter coupled between the mixer and the phase quantizer.

15. A demodulator as in claim 12 wherein said frequency synthesizer is a direct digital synthesizer.

16. A demodulator as in claim 1 wherein said mixer stage comprises a plurality of mixer substages, said plurality of mixer substages including at least one first mixer substage comprising:
   a direct digital synthesizer receiving said bitstream output and producing a synthesizer output;
   a signal mixer receiving said synthesizer output and a substage input and producing a mixer output; and
   a bandpass filter receiving the mixer output and producing a substage output;
wherein
   the synthesizer output minimizes a phase difference between the substage input and the substage output when said synthesizer output is mixed with said substage input;
   the substage input is an input to the mixer substage and the substage output is an output of the mixer substage.

17. A demodulator as in claim 16 wherein at least one second mixer substage comprises:
   a substage digital synthesizer receiving said bitstream output and producing a substage synthesizer output; and
   a substage mixer receiving said substage synthesizer output and a mixer substage input and producing a mixer substage output;
wherein
   the substage synthesizer output mixes with the mixer substage input to minimize a phase difference between the mixer substage input and the mixer substage output;
   the mixer substage input is an input to the second mixer substage; and
   the mixer substage output is an output of the second mixer substage.

18. A Hilbert sampler/filter circuit comprising:
   a circuit element having a transconductance;
   a plurality of sampler cells, each sampler cell comprising:
      a buffer coupled to a transmission switch;
      a sampler switch coupled between the circuit element and the buffer;
      a capacitor coupled between ground and a first connection point;
      a grounding switch coupled between the first connection point and ground; and
      a second connection point located between the sampler switch and the buffer, said second connection point also being coupled to the first connection point;
wherein for the plurality of sampler cells, only one sampler switch is closed during any one time interval.

19. A Hilbert sampler/filter circuit comprising:
   a grounding switch;
   a circuit element having a transconductance;
   a plurality of primary and secondary sampler cells, each sampler cell being coupled to both the circuit element and the grounding switch at a common node; -a plurality of filter cells each filter cell being coupled to a primary sampling cell; and
   an array of coupling switches for coupling any one of said primary sampler cells with any one of said secondary sampler cells,
wherein
   the grounding switch, when closed, couples said circuit element and each sampler cell to ground.

20. A sampler/filter circuit as in claim 19 wherein each sampler cell comprises:
   a buffer coupled between a primary sampler cell output and a first connection node;
   a first capacitor coupled between ground and the first connection node;
   a sampling switch coupled between the circuit element and a second connection node;
   an activation switch coupled between the second connection node and the first converter node;
wherein
   said array of coupling switches is coupled to each primary sampler cell at the second connection node;
   the state of the grounding switch is always opposite to the, state of the sampling switch.

21. A sampler/filter circuit as in claim 20 wherein each secondary sampler cell comprises a second capacitor coupled between ground and the array of coupling switches, said array of coupling switches comprising at least one coupling switch coupled between the second capacitor of a secondary sampler cell and a second connection node of a primary sampler cell.

22. A sampler/filter circuit comprising:
   a circuit element having a transconductance;
   a plurality of sampler cells, each sampler cell comprising:
      an operational amplifier coupled between a first sampler and a second sampler node;
      a sampling switch coupled between the circuit element and the second sampler node;
      a sampling capacitor coupled between the circuit element and the second sampler node;
      a sampling capacitor coupled between the second sampler node and ground;
      a pair of primary switches, one primary switch being coupled between a third sampler node and ground and the other primary switch being coupled between a fourth sampler node and ground;
      a pair of secondary switches, one secondary switch coupled between the third sampler node and the second sampler node, and the other secondary switch being coupled between the fourth sampler node and the first sampler node;
      a filtering capacitor coupled between the third sampler node an the fourth sampler node;
   wherein
      the first sampler node is between a sampler cell output and an output of the operational amplifier;
      the second sampler node is coupled to the negative input of the operational amplifier;
      the positive input of the operational amplifier is coupled to a predetermined reference voltage;
      both primary switches are switched simultaneously;
      both secondary switches are switched simultaneously.

23. A sampler/filter circuit comprising at least one pair of sampler cells such that each pair of sampler cells comprising:
   a first and a second sampling switch, the first sampling switch being coupled between a first intermediate node and an input and the second sampling switch being coupled between the input and a second intermediate node;
   a first and a second operational amplifier, the first operational amplifier being coupled between the first intermediate node and a first output node, the second operational amplifier being coupled between the second intermediate node and a second output node;

a pair of primary sampling capacitors, one primary sampling capacitor being coupled between the first intermediate node and a third intermediate node, the other primary sampling capacitor being coupled between the second intermediate node and a fourth intermediate node;

a pair of secondary sampling capacitors, one secondary sampling capacitor being coupled between the first intermediate node an a fifth intermediate node, the other secondary sampling capacitor being coupled between the second intermediate node and a sixth intermediate node;

a pair of filtering capacitors, one filtering capacitor being coupled between a negative input of the first operational amplifier and the first output node, the other filtering capacitor being coupled between a negative input of the second operational amplifier and the second output node;

for primary switches, each primary sampling switch being placed in the sampler cells such that a primary sampling switch is coupled between ground and each of the third, fourth, fifth and sixth intermediate nodes;

a negator for changing the polarity of a signal, said negator being coupled to the first output node;

four secondary sampling switches, said secondary switches being coupled such that:
- a first secondary sampling switch being coupled between the third intermediate node and the first output node;
- a second secondary sampling switch being coupled between the fourth intermediate node and the second output node;
- a third secondary sampling switch being coupled between the fifth intermediate node and the second output node;
- a fourth secondary sampling switch being coupled between the negator and the sixth intermediate node;

wherein
the negative input of the first operational amplifier is coupled to the first intermediate node;
the negative input of the second operational amplifier is coupled to the second intermediate node;
the positive input of both operational amplifiers is coupled to ground;
all primary sampling switches are switched simultaneously;
all secondary sampling switches are switched simultaneously.

24. A method of demodulating an input signal to produce a bitstream output, the method comprising:
a) receiving the input signal,
b) producing a first intermediate complex signal representing the input signal, said first intermediate complex signal having an inphase component and a quadrature component,
c) shifting the phase of the first intermediate complex signal in response to the bitstream output to produce a second intermediate complex signal,
d) determining a phase angle of the second intermediate complex signal,
e) producing the bitstream output by outputting a specific bit if the phase angle lags or leads a predetermined signal.

25. A method as in claim 24 wherein step b) is accomplished by performing a Hilbert transform on the input signal.

26. A method as in claim 24 wherein step b) is accomplished by repeatedly sampling the input signal over a sampling interval and storing each sampled change in a different capacitor and assigning complex coefficient values to each sampled charge to result in the first intermediate signal.

27. A method as in claim 24 further including the step:
b1) filtering out undesired signals from said input signal.

28. A method as in claim 24 wherein step c) includes;
c1) producing a mixer signal having a frequency dependent on the bitstream output,
c2) mixing the mixer signal to the first intermediate complex signal, wherein;
the mixing signal, when mixed with the quadrature representation of the input signal, acts to minimize a phase difference between the second intermediate complex signal and the quadrature representation of the input signal.

29. A method as in claim 28 further including the step:
c3) applying a bandpass filter to the first intermediate complex signal after the first intermediate complex signal has been mixed with the mixer signal to produce a bandpass output.

30. A method as in claim 29 further including:
c4) producing a final mixing signal dependent on the bitstream output,
c5) mixing said final mixing signal with the bandpass output to produce an amplitude output and the second intermediate complex signal.

31. A method of sampling an input signal, the method comprising:
a) receiving the input signal at a plurality of sampler cells, each sampler cell having a sampling switch for sampling the input signal;
b) sequentially closing the sampling switch at each sampler cell for a fixed time interval to sample the input signal at different instances;
c) accumulating a sampled charge at each sampler cell every time a sampler switch for said sampler cell is closed;
d) outputting the sampled charge from each sampler cell by closing a plurality of transmission switches, each transmission switch being coupled between a sampler cell and an output,
wherein
only one sampling switch is closed during any one time interval.

32. A method of sampling an input signal, the method comprising:
a) receiving the input signal at a plurality of sampler cells, each sampler cell having a sampling switch for sampling the input signal;
b) sequentially closing the sampling switch at each sampler cell for a fixed time interval to sample the input signal at different instances;
c) providing different filtering characteristics to said input signal by closing specific filtering switches to couple each sampling cell to a filter cell;
d) filtering said input signal after being received at each sampler cell,
wherein
only one sampling switch is closed during any one time interval.

33. A method as in claim 32 further including sequentially closing said specific filtering switches for each sampling cell such that each sampling cell is sequentially coupled to a plurality of filter cells, each sampling cell being coupled to a different filter cell duing different time intervals.

34. A sampler/filter circuit comprising:
   a plurality of sampler cells, each sampler cell comprising:
      an operational amplifier coupled between a first sampler and a second sampler node;
      a sampling switch coupled between the circuit element and the second sampler node;
      a sampling capacitor coupled between the circuit element and the second sampler node;
      a sampling capacitor coupled between the second sampler node and ground;
      a pair of primary switches, one primary switch being coupled between a third sampler node and ground and the other primary switch being coupled between a fourth sampler node and ground;
      a pair of secondary switches, one secondary switch coupled between the third sampler node and the second sampler node, and the other secondary switch being coupled between the fourth sampler node and the first sampler node;
      a filtering capacitor coupled between the third sampler node an the fourth sampler node;
   wherein
      the first sampler node is between a sampler cell output and an output of the operational amplifier;
      the second sampler node is coupled to the negative input of the operational amplifier;
      the positive input of the operational amplifier is coupled to a predetermined reference voltage;
      both primary switches are switched simultaneously;
      both secondary switches are switched simultaneously.

35. A sampler/filter circuit comprising:
   a plurality of sampler cells, each sampler cell comprising:
      a buffer coupled to a transmission switch;
      a sampler switch coupled between an input and the buffer;
      a capacitor coupled between ground and a first connection point;
      a grounding switch coupled between the first connection point and ground; and
      a second connection point located between the sampler switch and the buffer, said second connection point also being coupled to the first connection point;
   wherein for the plurality of sampler cells, only one sampler switch is closed during any one time interval.

36. A sampler/filter circuit comprising:
   a grounding switch;
   a plurality of primary and secondary sampler cells, each sampler cell being coupled to both an input and the grounding switch at a common node;
   a plurality of filter cells each filter cell being coupled to a primary sampler cell; and
   an array of coupling switches for coupling any one of said primary sampler cells with any one of said secondary sampler cells,
   wherein
      the grounding switch, when closed, couples each sampler cell to ground.

37. A sampler/filter circuit as in claim 36 wherein each sampler cell comprises:
   a buffer coupled between a primary sampler cell output and a first connection node;
   a first capacitor coupled between ground and the first connection node;
   a sampling switch coupled between the input and a second connection node;
   an activation switch coupled between the second connection node and the first converter node;
   wherein
      said array of coupling switches is coupled to each primary sampler cell at the second connection node;
      the state of the grounding switch is always opposite to the state of the sampling switch.

38. A sampler/filter circuit as in claim 37 wherein each secondary sampler cell comprises a second capacitor coupled between ground and the array of coupling switches, said array of coupling switches comprising at least one coupling switch coupled between the second capacitor of a secondary sampler cell and a second connection node of a primary sampler cell.

* * * * *